United States Patent
Zhang et al.

(10) Patent No.: US 10,984,867 B1
(45) Date of Patent: Apr. 20, 2021

(54) DIRECT LOOK AHEAD MODE FOR MEMORY APPARATUS PROGRAMMED WITH REVERSE ORDER PROGRAMMING

(71) Applicant: SanDisk Technologies LLC, Addison, TX (US)

(72) Inventors: Zhiping Zhang, San Jose, CA (US); Sarath Chandran Puthen Thermadam, San Jose, CA (US); Huai-Yuan Tseng, San Jose, CA (US); Deepanshu Dutta, San Jose, CA (US)

(73) Assignee: SanDiskTechnologies LLC, Addison, TX (US)

( * ) Notice: Subject to any disclaimer, the term of this patent is extended or adjusted under 35 U.S.C. 154(b) by 0 days.

(21) Appl. No.: 16/724,876

(22) Filed: Dec. 23, 2019

(51) Int. Cl.
| | | |
|---|---|---|
| *G11C 16/04* | (2006.01) | |
| *G11C 16/08* | (2006.01) | |
| *G11C 16/34* | (2006.01) | |
| *G11C 16/26* | (2006.01) | |
| *G11C 16/10* | (2006.01) | |

(52) U.S. Cl.
CPC .............. *G11C 16/08* (2013.01); *G11C 16/10* (2013.01); *G11C 16/26* (2013.01); *G11C 16/3404* (2013.01); *G11C 16/3427* (2013.01)

(58) Field of Classification Search
CPC ......... G11C 16/04; G11C 16/08; G11C 16/10; G11C 16/26; G11C 16/3404; G11C 16/3427
USPC ...................................... 365/185.01–185.07
See application file for complete search history.

(56) References Cited

U.S. PATENT DOCUMENTS

| | | | |
|---|---|---|---|
| 8,995,167 | B1 | 3/2015 | Kim et al. |
| 10,354,737 | B2 * | 7/2019 | Hu ................. G11C 16/349 |
| 2007/0121386 | A1 | 5/2007 | Ho et al. |
| 2010/0061151 | A1 | 3/2010 | Miwa et al. |
| 2011/0096603 | A1 | 4/2011 | Lasser |
| 2012/0140568 | A1 | 6/2012 | Dutta et al. |
| 2018/0374551 | A1 * | 12/2018 | Hu ................. G11C 16/349 |
| 2019/0392909 | A1 * | 12/2019 | Yang ............. G11C 16/3459 |

OTHER PUBLICATIONS

International Search Report and Written Opinion, PCT/US2020/024831, dated Sep. 11, 2020.

* cited by examiner

*Primary Examiner* — Harry W Byrne
(74) *Attorney, Agent, or Firm* — Dickinson Wright PLLC; Steven Hurles

(57) ABSTRACT

A memory apparatus and method of operation are provided. The apparatus includes first memory cells coupled to control circuit and a particular word line and storing a first cell data. The apparatus also includes second memory cells coupled to a source side neighbor word line disposed on a source side of the particular word line and storing second cell threshold voltages programmed after the first cell data. The control circuit senses the second cell threshold voltages at a first time while applying a predetermined initial read voltage to the source side neighbor word line. The control circuit senses the first cell data at a second time while iteratively applying one of a plurality of particular read voltages to the particular word line and simultaneously and iteratively applying one of a plurality of neighbor pass voltages to the source side neighbor word line based on the second cell threshold voltages.

20 Claims, 16 Drawing Sheets

DIRECT LOOK AHEAD MODE FOR MEMORY APPARATUS PROGRAMMED WITH REVERSE ORDER PROGRAMMING

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory apparatuses have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory apparatuses to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory apparatus includes memory cells which may be arranged in strings, for instance, where select gate transistors are provided at the ends of the string to selectively connect a channel of the string to a source line or bit line. However, various challenges are presented in operating such memory devices. Accordingly, there is still a need for improved memory apparatuses.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide an apparatus including a plurality of first memory cells coupled to a particular word line and storing a first cell data. The apparatus can also include a plurality of second memory cells coupled to a source side neighbor word line disposed on a source side of the particular word line and storing second cell threshold voltages programmed after the first cell data in a reverse order programming sequence. A control circuit is coupled to the plurality of first and second memory cells and configured to sense the second cell threshold voltages at a first time while applying a predetermined initial read voltage to the source side neighbor word line. The control circuit is also configured to sense the first cell data at a second time while iteratively applying one of a plurality of particular read voltages to the particular word line and simultaneously and iteratively applying one of a plurality of neighbor pass voltages to the source side neighbor word line based on the second cell threshold voltages sensed at the first time.

According to another aspect of the disclosure a controller is provided. The controller is in communication with a plurality of first memory cells of a memory apparatus coupled to a particular word line and storing a first cell data. The controller is also in communication with a plurality of second memory cells of a memory apparatus coupled to a source side neighbor word line disposed on a source side of the particular word line and storing second cell threshold voltages programmed after the first cell data in a reverse order programming sequence. The controller configured to instruct the memory apparatus to sense the second cell threshold voltages at a first time while applying a predetermined initial read voltage to the source side neighbor word line. The controller is additionally configured to instruct the memory apparatus to sense the first cell data at a second time while iteratively applying one of a plurality of particular read voltages to the particular word line and simultaneously and iteratively applying one of a plurality of neighbor pass voltages to the source side neighbor word line based on the second cell threshold voltages sensed at the first time.

According to an additional aspect of the disclosure, a method of operating a memory apparatus is also provided. The apparatus includes a plurality of first memory cells coupled to a particular word line and storing a first cell data. The memory apparatus also includes a plurality of second memory cells coupled to a source side neighbor word line disposed on the source side of the particular word line and storing second cell threshold voltages programmed after the first cell data in a reverse order programming sequence. The method includes the step of sensing the second cell threshold voltages at a first time while applying a predetermined initial read voltage to the source side neighbor word line. The method continues with the step of sensing the first cell data at a second time while iteratively applying one of a plurality of particular read voltages to the particular word line and simultaneously and iteratively applying one of a plurality of neighbor pass voltages to the source side neighbor word line based on the second cell threshold voltages sensed at the first time.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 9:
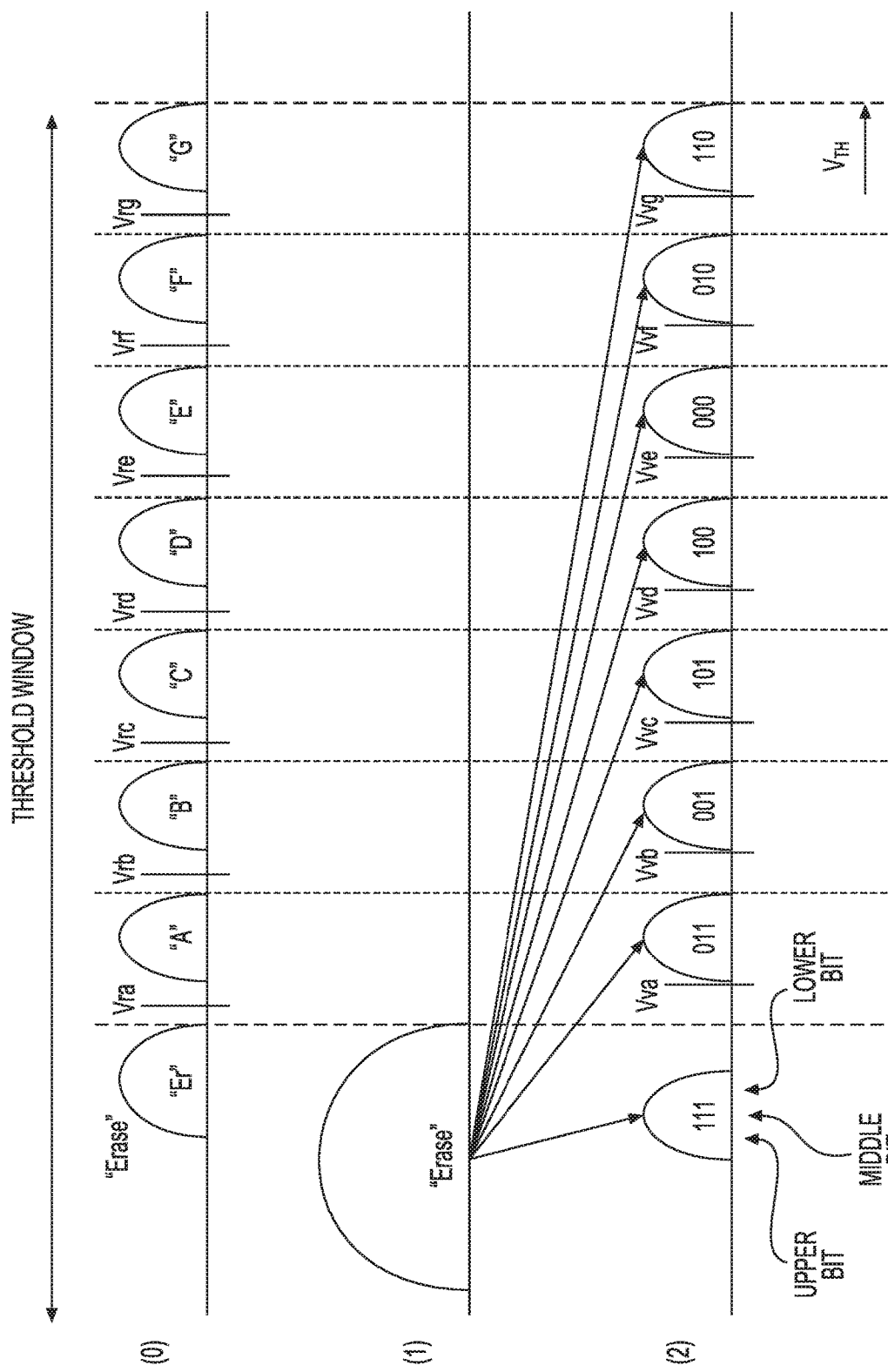
Figure 12:
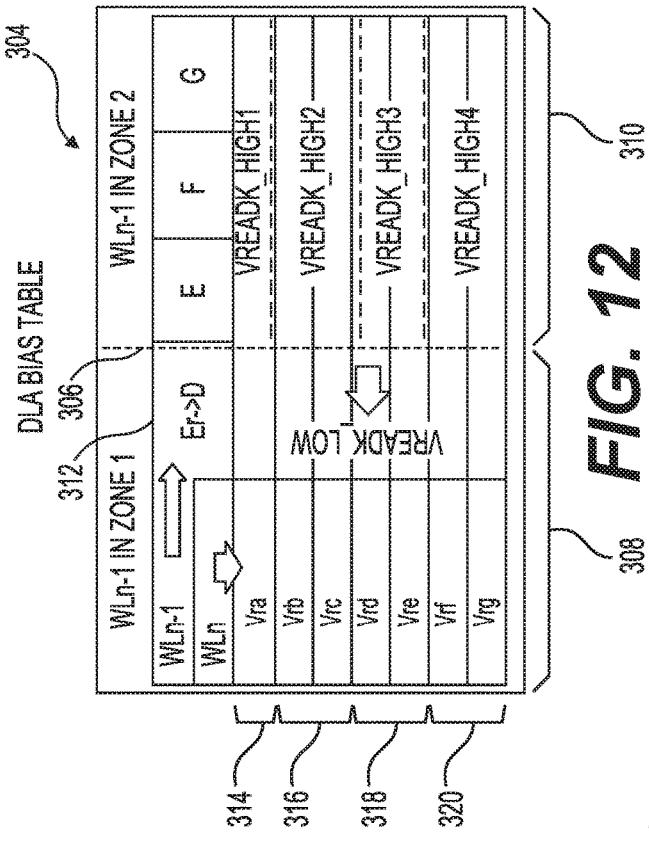
Figure 13:
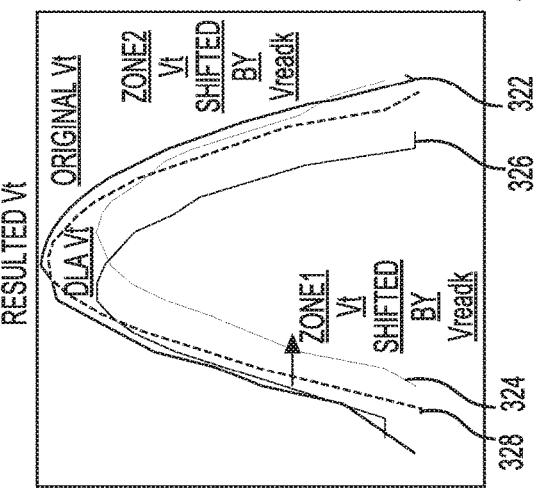
Figure 11:
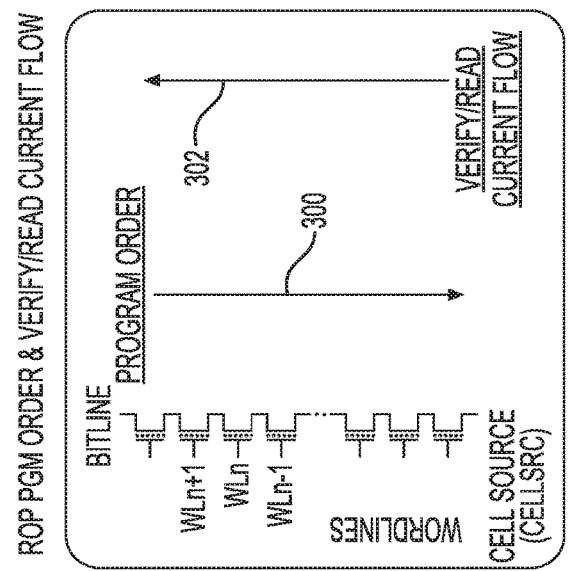
Figure 14:
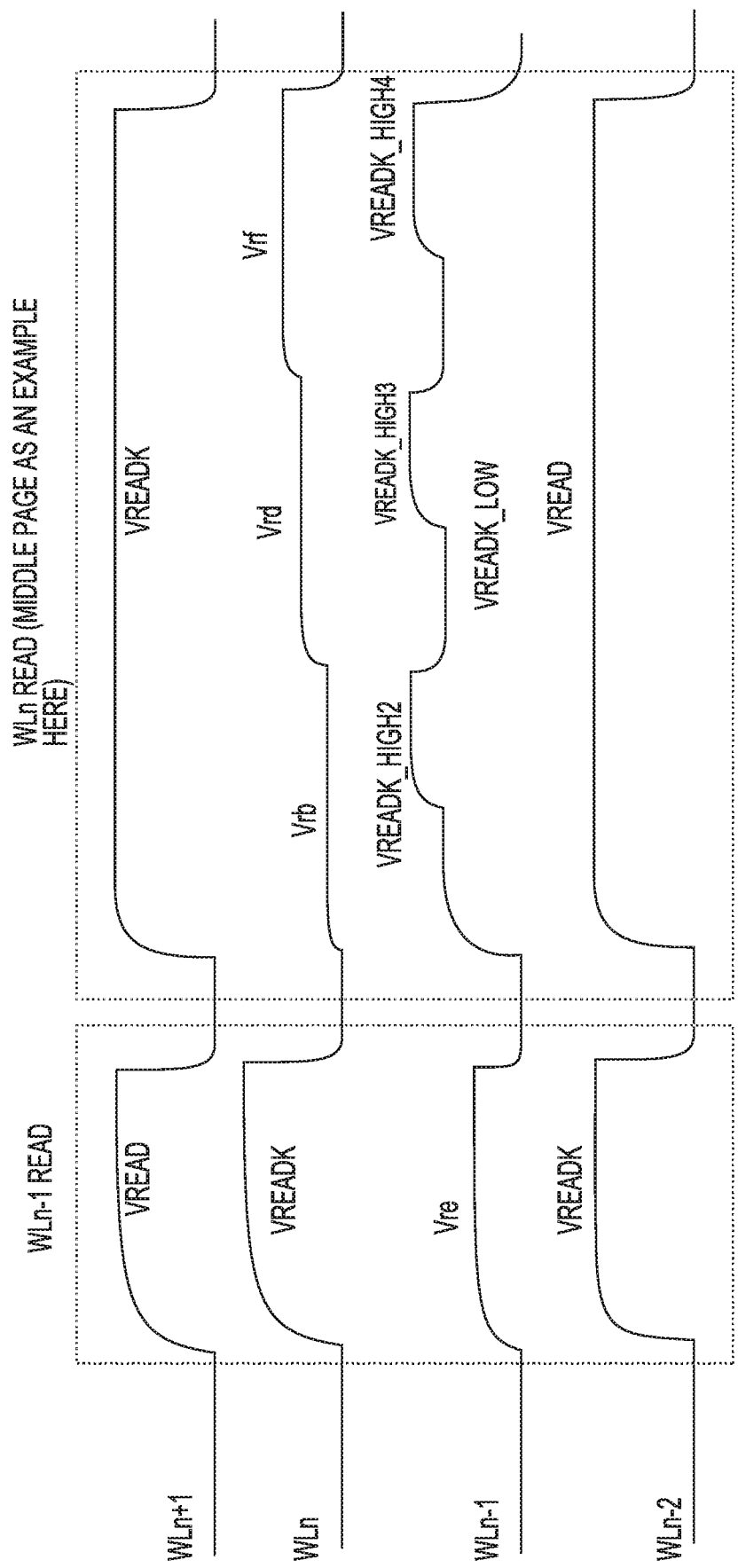
Figure 15:
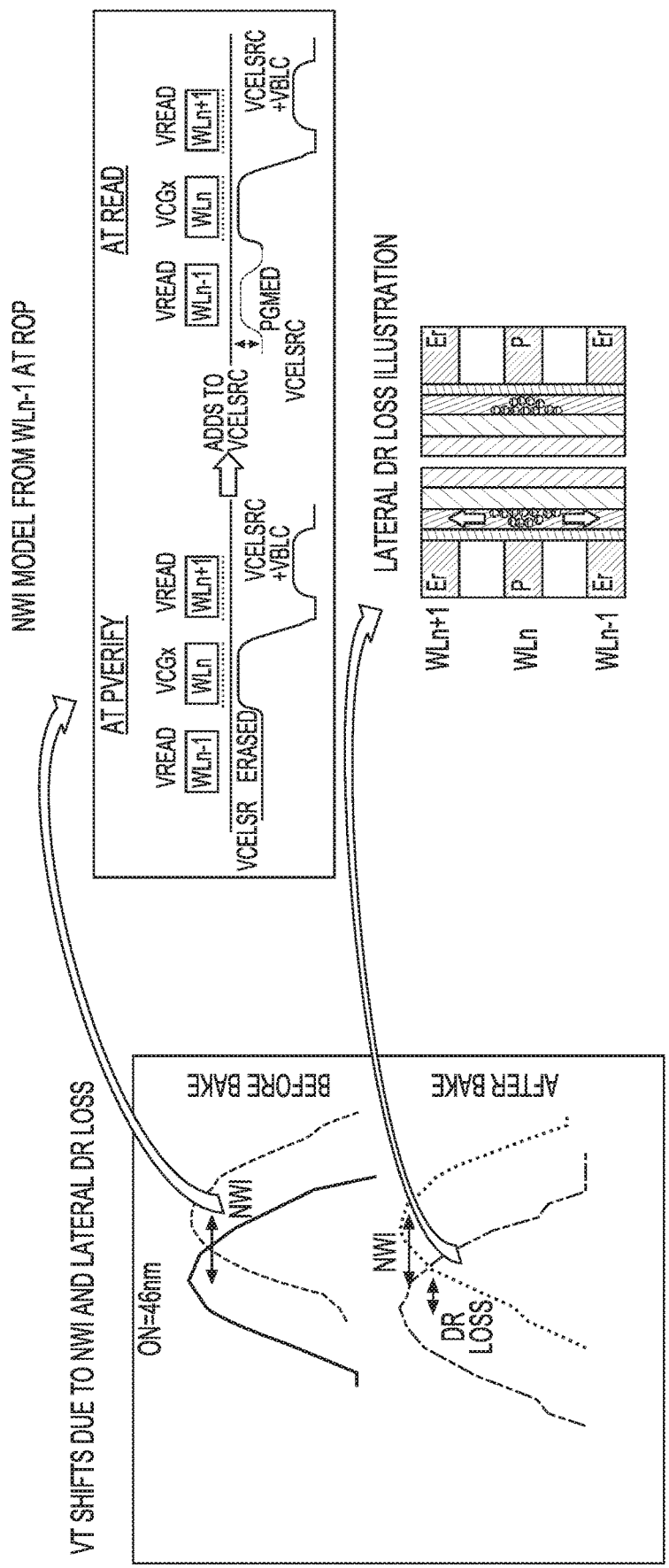
Figure 17:
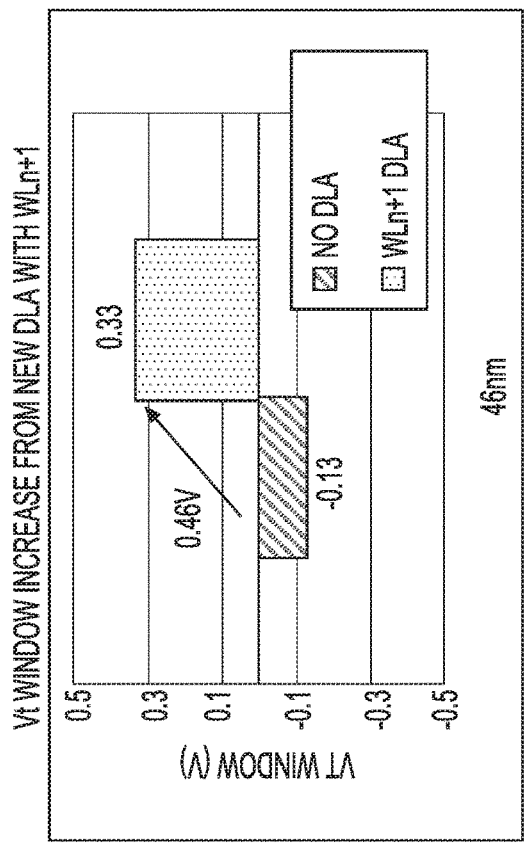
Figure 16:
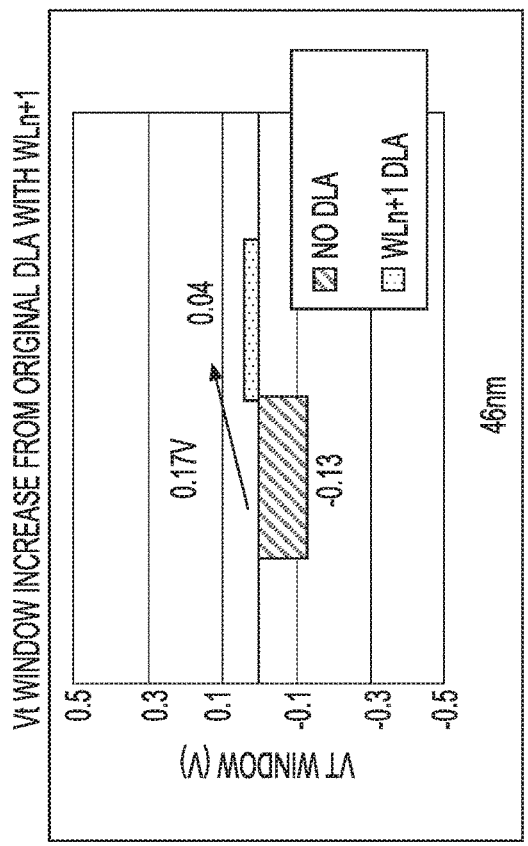
Figures 18, 19:
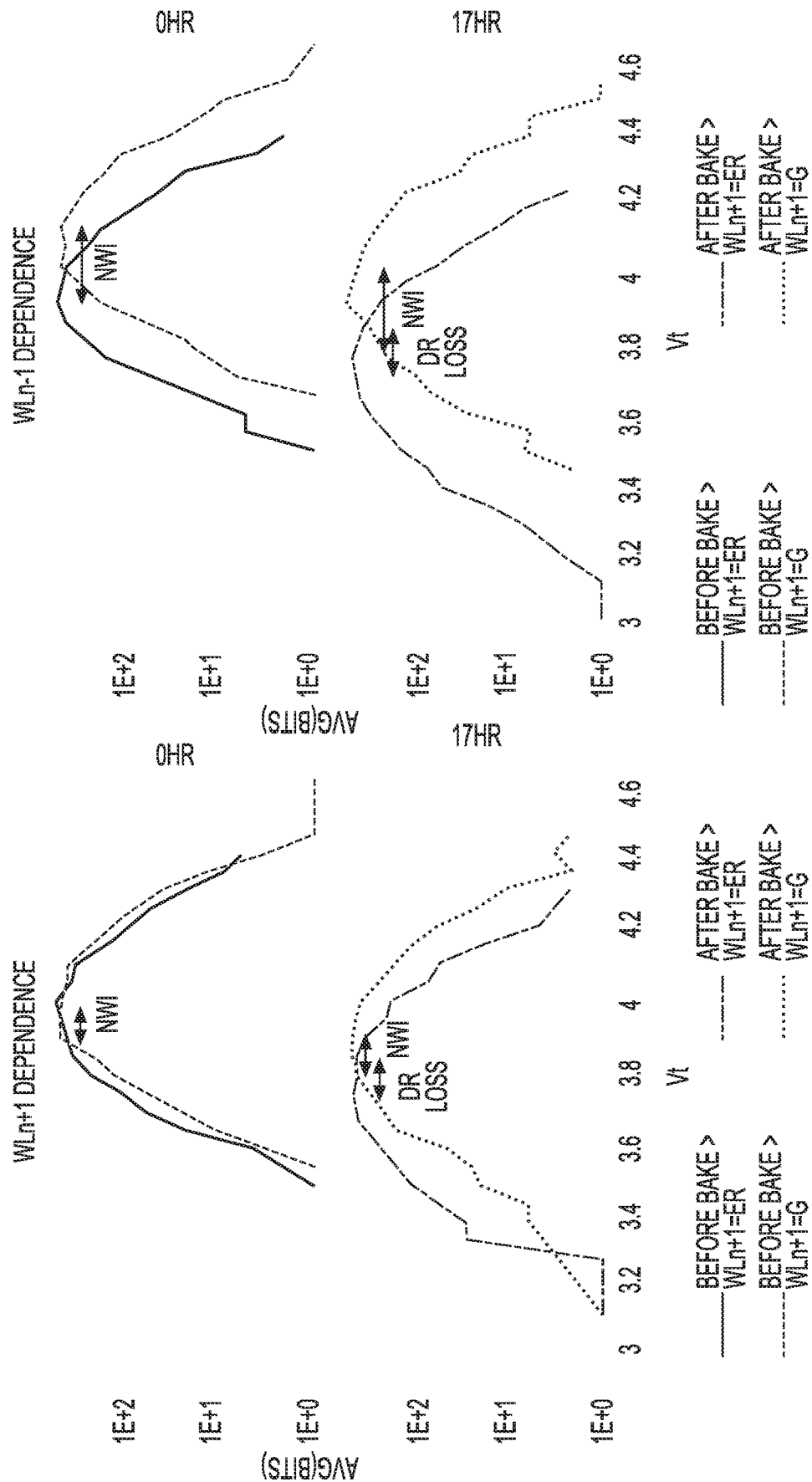
Figure 20:
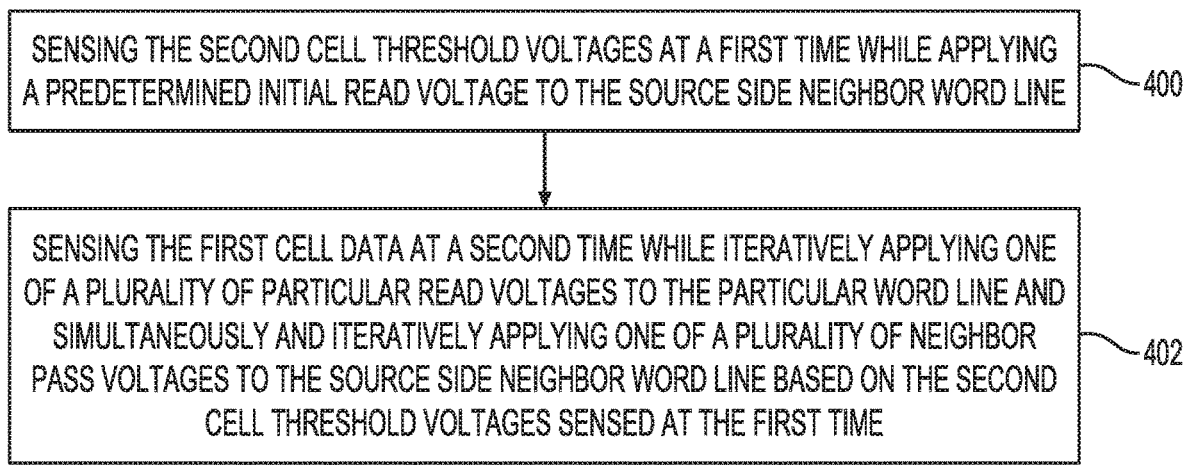
Figure 21A:
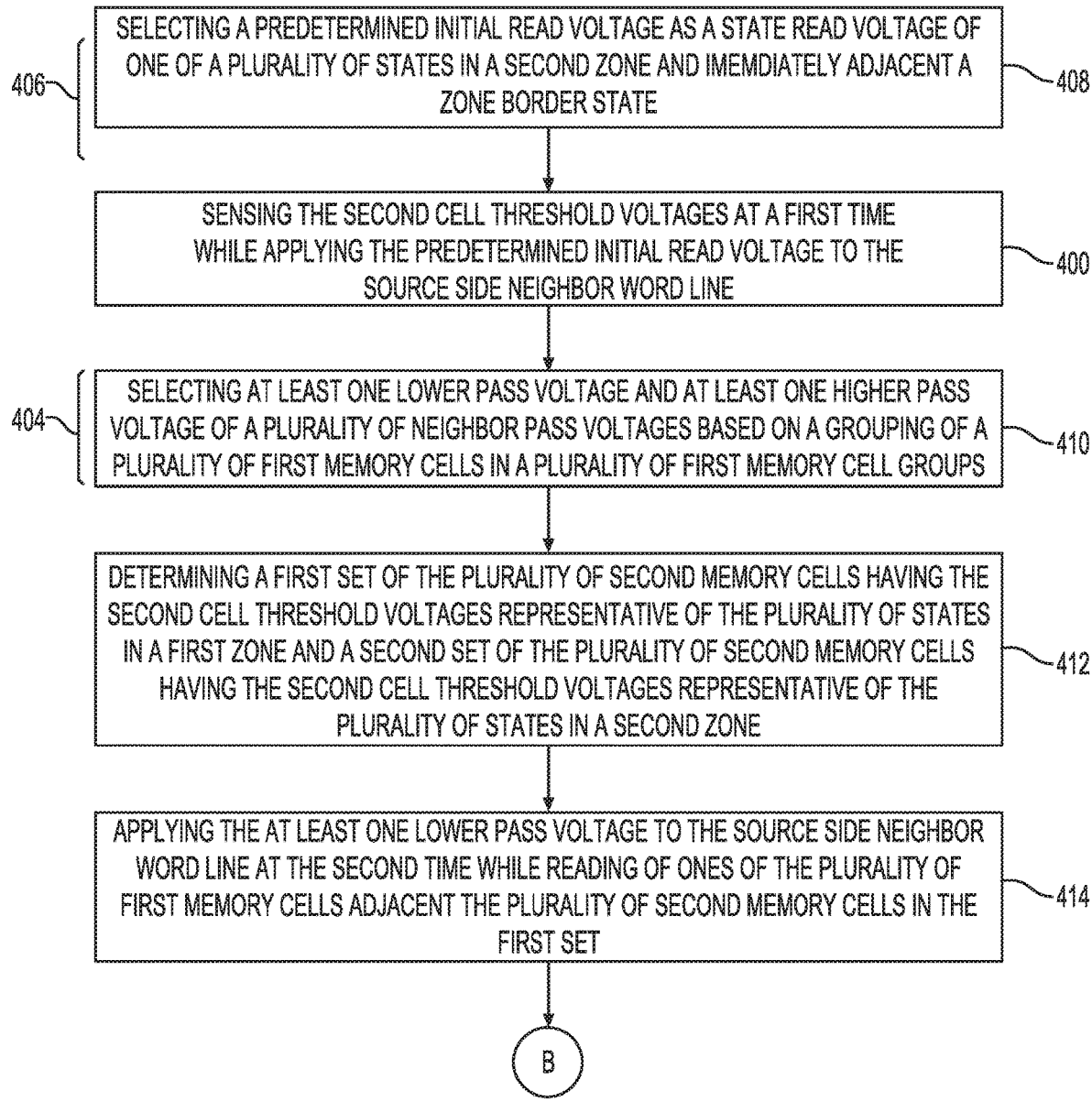
Figure 21B:
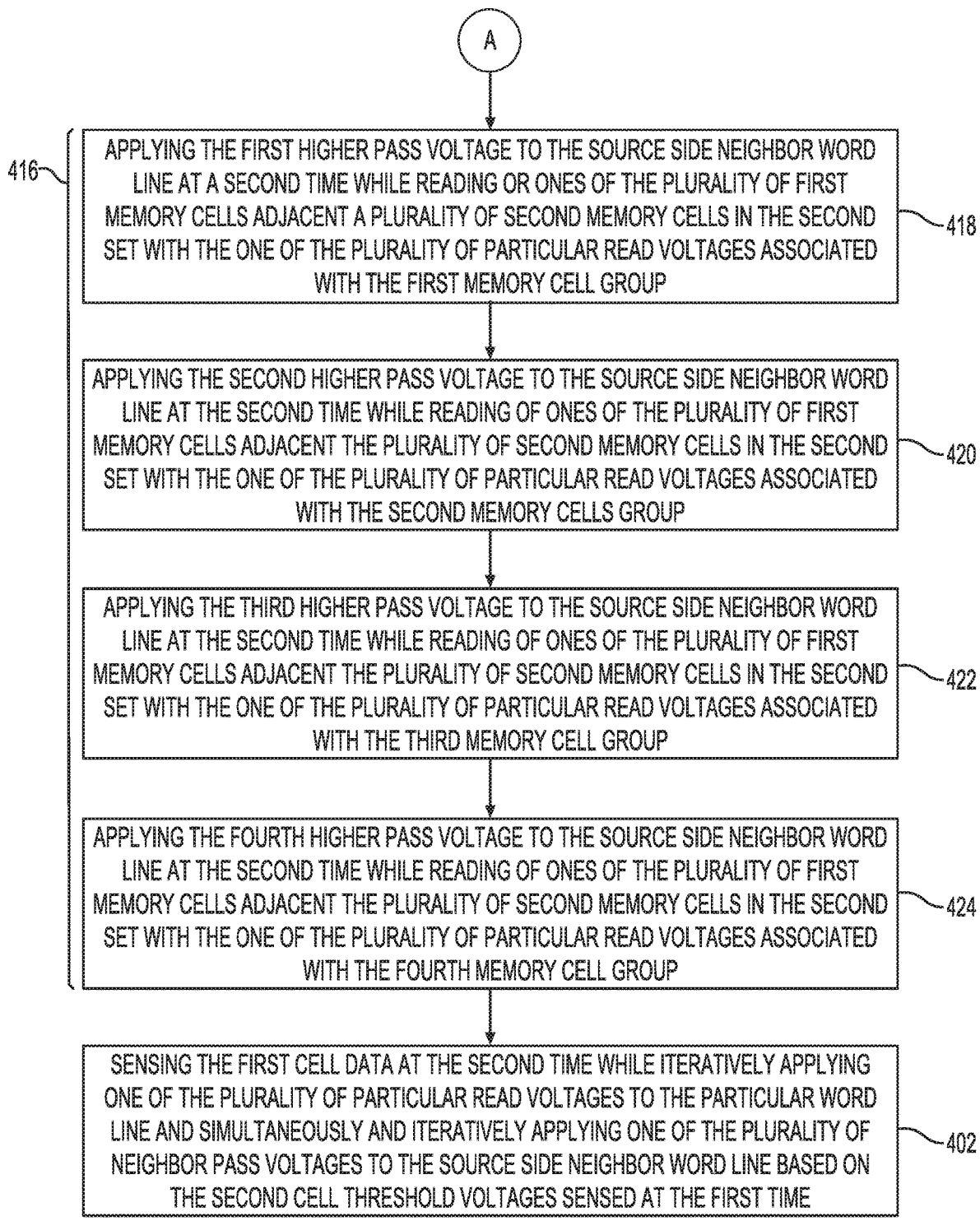

FIGS. 9(0)-9(2) illustrate an example of programming a population of 8-state memory cells according to aspects of the disclosure;

FIG. 11 depicts a reverse programming order and a verify/read current flow of a NAND string according to aspects of the disclosure;

FIG. 12 shows a direct look ahead bias table used for reverse order programming according to aspects of the disclosure;

FIG. 13 shows a resulting plot of threshold voltages using the direct look ahead bias table of FIG. 12 according to aspects of the disclosure;

FIG. 14 illustrates a voltage versus time waveform showing example operation of the disclosed apparatus using the direct look ahead bias table of FIG. 12 during a read of a particular word line according to aspects of the disclosure;

FIG. 15 shows additional details regarding the improved direct look ahead operation for reverse order programming using the direct look ahead bias table of FIG. 12 according to aspects of the disclosure;

FIG. 16 shows an increase of a threshold voltage window using a direct look ahead mode typically used with normal-order programming according to aspects of the disclosure;

FIG. 17 shows an increase in the threshold voltage window using the direct look ahead bias table of FIG. 12 according to aspects of the disclosure;

FIGS. 18 and 19 show lateral data retention loss variation and neighboring word line interference to the threshold voltage due to neighboring word lines according to aspects of the disclosure; and FIGS. 20 and 21A-21B show steps of a method of operating the memory apparatus according to aspects of the disclosure.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of forming of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

Figure 1:
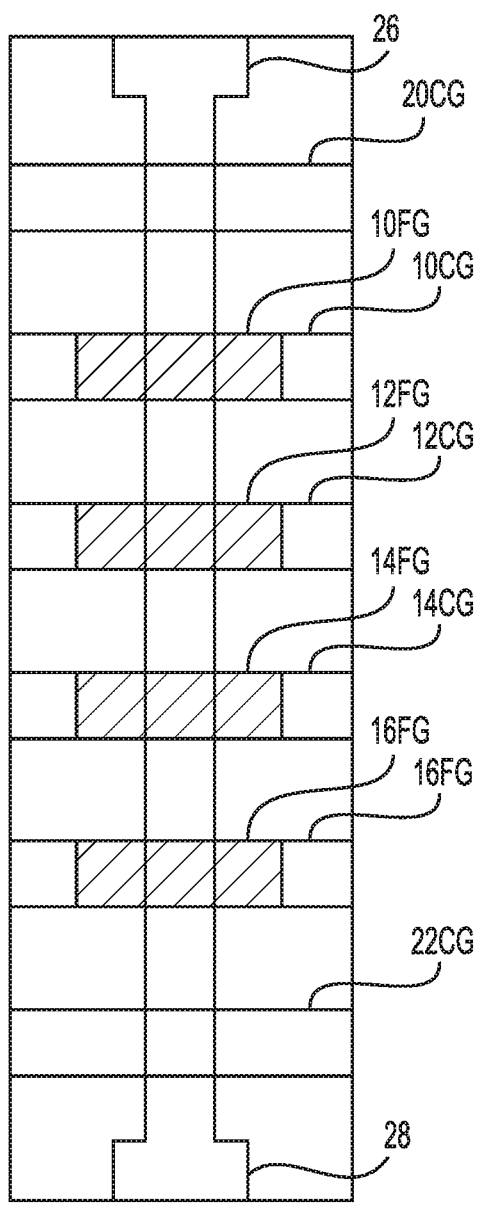
FIG. 1 is a top view of a NAND string according to aspects of the disclosure.
Figure 2:
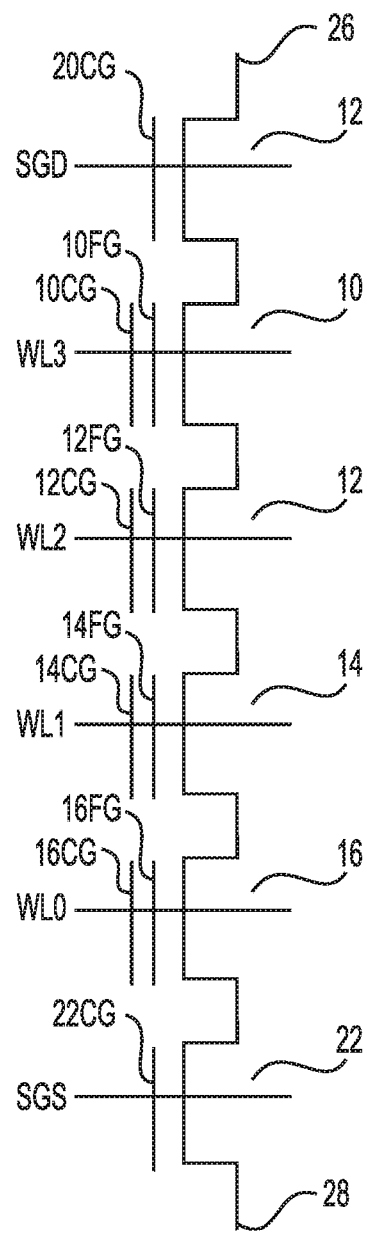
FIG. 2 is an equivalent circuit diagram of the NAND string of FIG. 1 according to aspects of the disclosure.

One example of a flash memory system uses the NAND structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 10, 12, 14 and 16 in series between a first select gate 12 and a second select gate 22. Select gate 12 connects the NAND string to bit line terminal 26. Select gate 22 connects the NAND string to source line terminal 28. Select gate 12 is controlled by applying appropriate voltages to control gate 20CG via selection line SGD. Select gate 22 is controlled by applying the appropriate voltages to control gate 22CG via selection line SGS. Each of the transistors 10, 12, 14 and 16 includes a control gate and a floating gate, forming the gate elements of a memory cell. For example, transistor 10 includes control gate 10CG and floating gate 10FG. Transistor 12 includes control gate 12CG and a floating gate 12FG. Transistor 14 includes control gate 14CG and floating gate 14FG. Transistor 16 includes a control gate 16CG and a floating gate 16FG. Control gate 10CG is connected to word line WL3, control gate 12CG is connected to word line WL2, control gate 14CG is connected to word line WL1, and control gate 16CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string. A typical architecture for a flash memory system using a NAND structure will include several NAND strings. Relevant examples of NAND-type flash memories and their operation are provided in the following U.S. patents/patent applications, all of which are incorporated herein by reference in their entirety: U.S. Pat. Nos. 5,570,315; 5,774,397; 6,046,935; 5,386,422; 6,456,528; and U.S. patent application Ser. No. 09/893,277 (Publication No. US2003/0002348). Other types of non-volatile memory in addition to NAND flash memory can also be used in accordance with embodiments.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage Vt of the memory cell is raised so that the memory cell is in a programmed state. The floating gate charge and threshold voltage Vt of the cell can be indicative of a particular state corresponding to stored data. More information about programming can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

Figure 3:
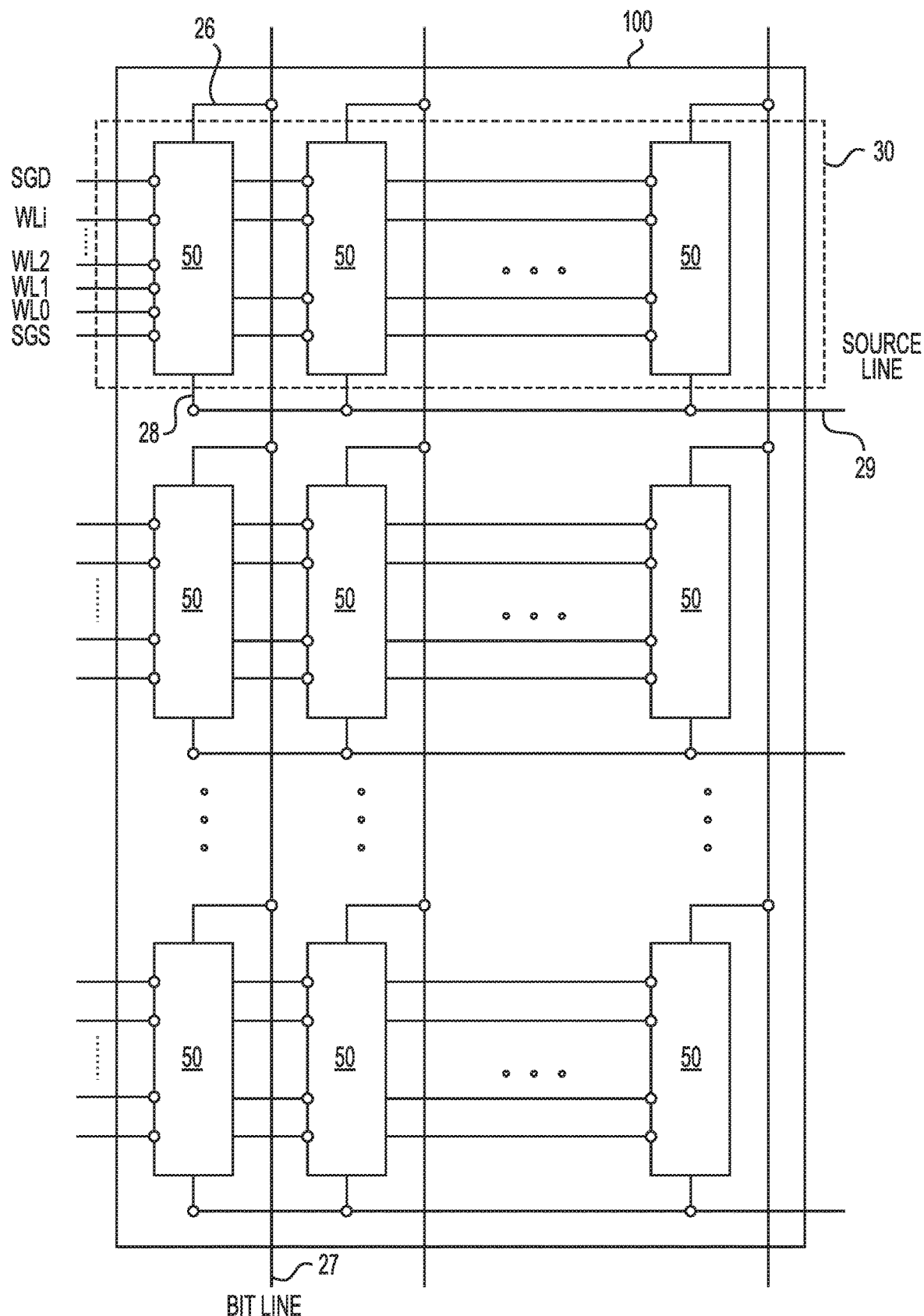
FIG. 3 is a block diagram of an array of NAND flash memory cells according to aspects of the disclosure.

FIG. 3 illustrates an exemplary array 100 of NAND strings 50, such as those shown in FIGS. 1-2. Along each column, a bit line 27 is coupled to a drain terminal 26 of the bit line select gate for the NAND string 50. Along each row of NAND strings, a source line 29 may connect all the source terminals 28 of the source line select gates of the NAND strings.

The array 100 of memory cells is divided into a large number of blocks of memory cells. As is common for flash EEPROM systems, the block is the unit of erase and may be referred to as an erase block or physical block. Each block can contain the minimum number of memory cells that are erased together. In FIG. 3, a block such as block 30 includes all the cells connected to a common set of word lines WL0-WLi. Each block is typically divided into a number of pages. A page is typically a minimum unit of programming or reading, although more than one page may be programmed or read in a single operation. In another embodiment, the individual pages may be divided into segments and the segments may contain the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than those of the user data to which they pertain.

A sector of user data is typically 512 bytes, corresponding to the size of a sector commonly used in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 20 volts) for a sufficient period of time and grounding the word lines of a selected block while the source and bit lines are floating. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Those cells whose erase is to be inhibited have their word lines set to a floating condition. Due to capacitive coupling, the unselected word lines, bit lines, select lines, and common source lines are also raised to a significant fraction of the erase voltage, thus inhibiting erasing of the unselected cells. Erasing can be performed on the entire memory array, separate blocks, or another unit of cells.

Each block of memory cells includes a set of bit lines forming columns and a set of word lines forming rows. In one embodiment, the bit lines are divided into odd bit lines and even bit lines. Memory cells along a common word line and connected to the odd bit lines are programmed at one time, while memory cells along a common word line and connected to even bit lines are programmed at another time ("odd/even programming"). In another embodiment, memory cells are programmed along a word line for all bit lines in the block ("all bit line programming"). In other embodiments, the bit lines or block can be broken up into other groupings (e.g., left and right, more than two groupings, etc.).

Figure 4:
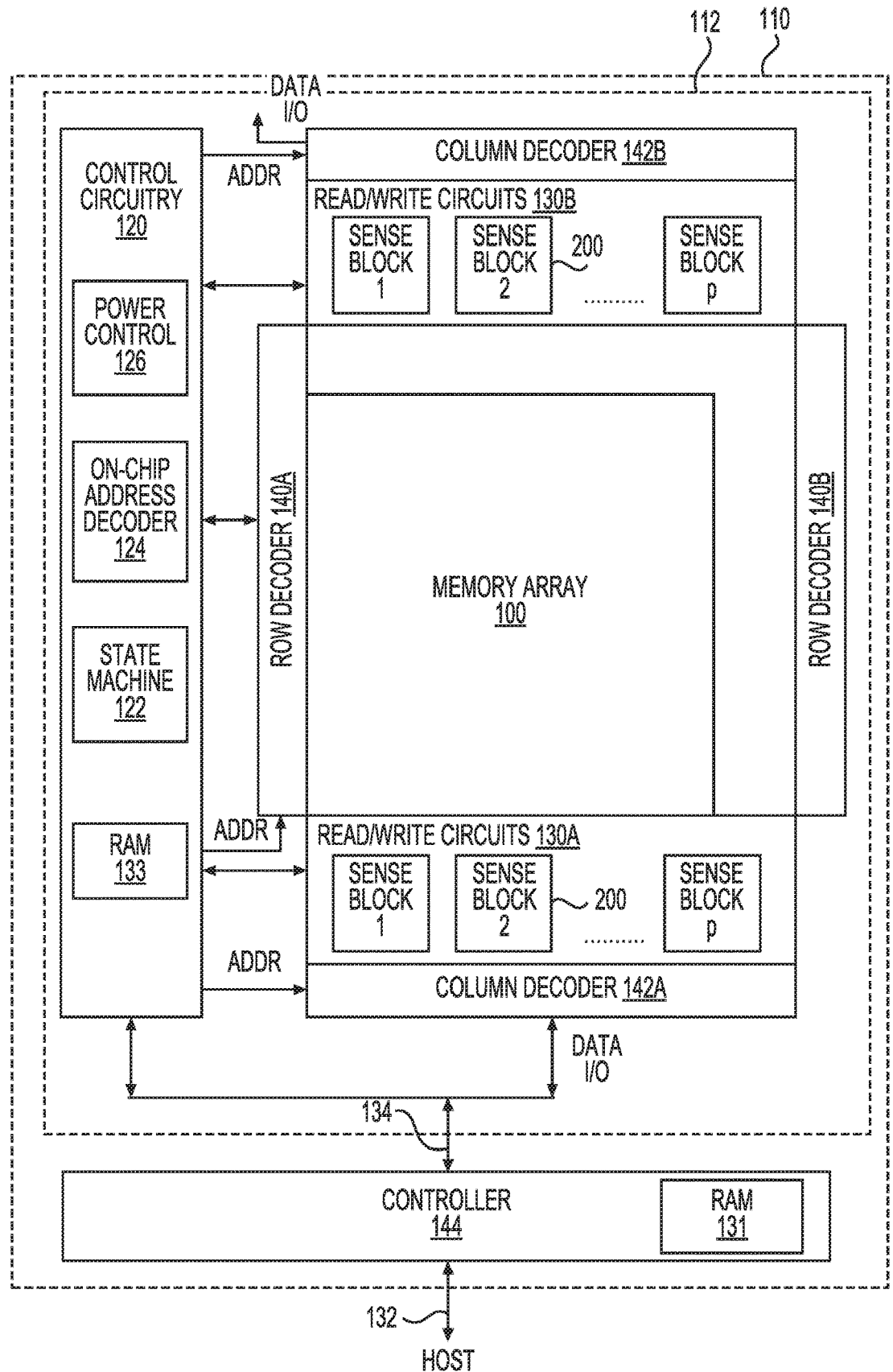
FIG. 4 is a block diagram of a non-volatile memory system according to aspects of the disclosure.

FIG. 4 illustrates a memory device or apparatus 110 having read/write circuits for reading and programming a page of memory cells in parallel. Memory device 110 may include one or more memory die or chips 112. Memory die 112 includes a two-dimensional array of memory cells 100, control circuitry 120, and read/write circuits 130A and 130B. In one embodiment, access to the memory array 100 by the various peripheral circuits is implemented in a symmetric fashion, on opposite sides of the array, so that the densities of access lines and circuitry on each side are reduced by half. The read/write circuits 130A and 130B include multiple sense blocks 200 which allow a page of memory cells to be read or programmed in parallel. The memory array 100 is addressable by word lines via row decoders 140A and 140B and by bit lines via column decoders 142A and 142B. In a typical embodiment a controller 144 is included in the same memory device 110 (e.g., a removable storage card or package) as the one or more memory die 112. Commands and data are transferred between the host and controller 144 via lines 132 and between the controller and the one or more memory die 112 via lines 134. The controller can include an optional RAM memory 131 in one embodiment to assist in data transfer.

The control circuitry 120 cooperates with the read/write circuits 130A and 130B to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140A, 140B, 142A, and 142B. The power control module 126 controls the power and voltages supplied to the word lines and bit lines during memory operations. An optional RAM memory 133 is provided in one embodiment to assist in memory operations.

Figure 5:
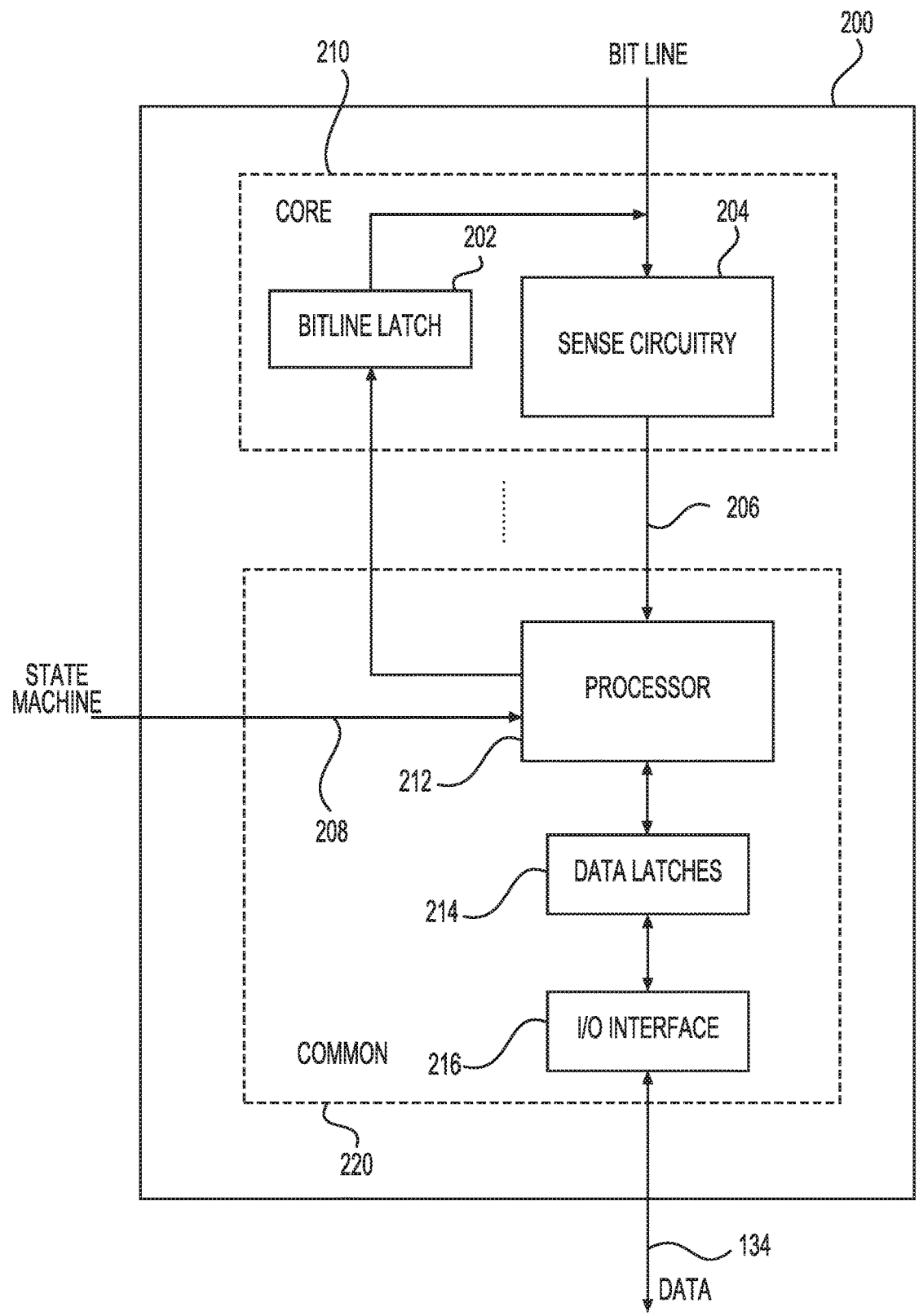
FIG. 5 is a block diagram of one embodiment of a sense block according to aspects of the disclosure.

FIG. 5 is a block diagram of an individual sense block 200 partitioned into a core portion, referred to as a sense module 210, and a common portion 220. In one embodiment, there will be a separate sense module 210 for each bit line and one common portion 220 for a set of multiple sense modules 210. In one example, a sense block will include one common portion 220 and eight sense modules 210. Each of the sense modules in a group will communicate with the associated common portion via a data bus 206. For further details refer to U.S. patent application Ser. No. 11/026,536 "Non-Volatile Memory & Method with Shared Processing for an Aggregate of Sense Amplifiers" filed on Dec. 29, 2004 which is incorporated by reference herein in its entirety.

Sense module 210 comprises sense circuitry 204 that determines whether a conduction current in a connected bit line is above or below a predetermined threshold level. Sense module 210 also includes a bit line latch 202 that is used to set a voltage condition on the connected bit line. For example, a predetermined state latched in bit line latch 202 will result in the connected bit line being pulled to a state designating program inhibit (e.g., Vdd).

Common portion 220 includes a processor 212, a set of data latches 214 and an I/O Interface 216 coupled between the set of data latches 214 and data bus 134. Processor 212 performs computations. For example, one of its functions is to determine the data stored in the sensed memory cell and store the determined data in the set of data latches. The set of data latches 214 is used to store data bits determined by processor 212 during a read operation. It is also used to store data bits imported from the data bus 134 during a program operation. The imported data bits represent write data meant to be programmed into the memory. I/O interface 216 provides an interface between data latches 214 and the data bus 134.

During read or sensing, the operation of the system is under the control of state machine 122 of FIG. 4 that controls the supply of different control gate voltages to the addressed cell via word lines. As it steps through the various predefined control gate voltages corresponding to the various memory states supported by the memory, the sense module 210 will trip at one of these voltages and an output will be provided from sense module 210 to processor 212 via bus 206. At that point, processor 212 determines the resultant memory state by consideration of the tripping event(s) of the sense module and the information about the applied control gate voltage from the state machine via input lines 208. It then computes a binary encoding for the memory state and stores the resultant data bits into data latches 214. In another embodiment of the core portion, bit line latch 202 serves double duty, both as a latch for latching the output of the sense module 210 and also as a bit line latch as described above.

During program or verify, the data to be programmed is stored in the set of data latches 214 from the data bus 134. The program operation, under the control of the state machine, comprises a series of programming voltage pulses applied to the control gates of the addressed memory cells. Each programming pulse is followed by a read back (verify) to determine if the cell has been programmed to the desired memory state target threshold voltage. Processor 212 monitors the read back memory state relative to the desired memory state. When the two are in agreement, the processor 212 sets the bit line latch 202 so as to cause the bit line to be pulled to a condition designating program inhibit (e.g., Vdd). This inhibits the cell coupled to the bit line from further programming even if programming pulses appear on its control gate. In other embodiments the processor initially loads the bit line latch 202 and the sense circuitry sets it to an inhibit value during the verify process.

Data latch stack 214 contains a stack of data latches corresponding to the sense module. In one embodiment, there are three data latches per sense module 210. In some implementations (but not required), the data latches are implemented as a shift register so that the parallel data stored therein is converted to serial data for data bus 134, and vice versa. In the preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

In general, memory cells of a page are operated on in parallel. Therefore a corresponding number of sense modules 210 are in operation in parallel. In one embodiment, a page controller (not shown) expediently provides control and timing signals to the sense modules operated in parallel. For more details regarding sense modules 210 and their operation, see U.S. patent application Ser. No. 11/099,133, entitled "Compensating For Coupling During Read Operations Of Non-Volatile Memory," filed Apr. 5, 2005, incorporated by reference in its entirety. Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," Inventor Raul-Adrian Cernea, filed on Dec. 16, 2004; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

In one embodiment, data is programmed to memory cells along a common word line. This word line may be referred to as the selected or particular word line. The remaining word lines of a block are referred to as unselected word lines. The selected word line may have one or two neighboring word lines. If the selected word line has two neighboring word lines, then the neighboring word line on the drain side is referred to as the drain side neighboring word line and the neighboring word line on the source side is referred to as the source side neighboring word line. For example, if WL2 of FIG. 2 is the selected or particular word line, then WL1 is the source side neighboring word line and WL3 is the drain side neighboring word line.

Shifts in the apparent charge stored on a floating gate can occur because of coupling of an electric field based on the charge stored in neighboring floating gates. This floating gate to floating gate coupling phenomena is described in U.S. Pat. No. 5,867,429, which is incorporated herein by reference in its entirety. The floating gate to floating gate coupling phenomena occurs most pronouncedly, although not exclusively, between sets of adjacent memory cells that have been programmed at different times. For example, a first memory cell can be programmed to add a level of charge to its floating gate that corresponds to a set of data. Subsequently, one or more adjacent memory cells are programmed to add a level of charge to their floating gates that correspond to a set of data. After one or more of the adjacent memory cells are programmed, the charge level read from the first memory cell may appear to be different than when it was programmed because of the effect of the charge on the adjacent memory cell(s) being coupled to the first memory cell. The coupling from adjacent memory cells can shift the apparent charge level being read from a selected memory cell by a sufficient amount to lead to an erroneous reading of the stored data.

As memory cells continue to shrink in size, the natural programmed and erase distributions of threshold voltages are expected to increase due to short channel effects, greater oxide thickness/coupling ratio variations and more channel dopant fluctuations, reducing the available separation between adjacent states. This effect is much more significant for multi-state memories than binary memories using only two states. The reduction of the space between word lines and between bit lines will also increase the coupling between adjacent floating gates. The effect of the floating gate to floating gate coupling is of greater concern for multi-state devices because the allowed threshold voltage ranges and the forbidden ranges (range between two distinct threshold voltage ranges that represent distinct memory states) are narrower than in binary devices. Therefore, floating gate to floating gate coupling or the WL-WL Yupin effect can result in memory cells being shifted from an allowed threshold voltage range to a forbidden range.

Typically, memory cells in a NAND string are programmed using normal-order programming. More specifically, normal-order programming involves programming the selected or particular word line (e.g., WL2 in FIG. 2) first and then programming the drain side neighbor word line (e.g., WL3 in FIG. 1) or a word line on a drain side of the particular word line. Correction for WL-WL Yupin effect during sensing can be accomplished by the Look-Ahead ("LA") technique. The LA sensing scheme has been disclosed in U.S. Pat. No. 7,196,928 and United States Patent Application Publication No. US-2006-0221714-A1 published on October, 2006, entitled, "Read Operations for Non-Volatile Storage that Includes Compensation for Coupling," which entire disclosure is herein incorporated by reference. Read with the LA correction basically examines the memory states programmed into the cells on an adjacent word line and corrects any perturbation effect they have on the memory cells being read on the current word line. If the pages have been programming according to the preferred programming scheme described above, then the adjacent word line will be from the word line (WLn+1) immediately above the current or particular word line (WLn). The LA correction scheme reads the data on the adjacent word line to be prior to the particular word line.

An alternative, more preferred scheme for correction of Yupin effect during read is the Direct LA scheme ("DLA"). DLA is disclosed in U.S. patent application Ser. No. 11/377,972 filed on Mar. 17, 2006, entitled, "System for Performing Read Operations on Non-Volatile Storage with Compensation for Coupling," which entire disclosure is herein incorporated by reference. The DLA scheme also makes correction to the reading of a cell in the current or particular word line by taking into account the programmed state of the adjacent cell on the next word line. Instead of simply biasing the current or particular word line during read, the correction is effected by biasing the adjacent or neighboring word line in such a way that the resultant floating-gate coupling offsets the WL-WL Yupin effect errors.

So, for example, a 1-bit DLA read mode can implemented with different neighbor pass voltages applied to the drain side neighbor word line (e.g., WL3 in FIG. 1) during a read of the particular word line (e.g., WL2 in FIG. 2). Nevertheless, instead of normal-order programming, reverse-order programming (ROP) may also be used, so more neighboring word line interference is from the source side neighbor word line (e.g., WL1 in FIG. 2).

Figure 6:
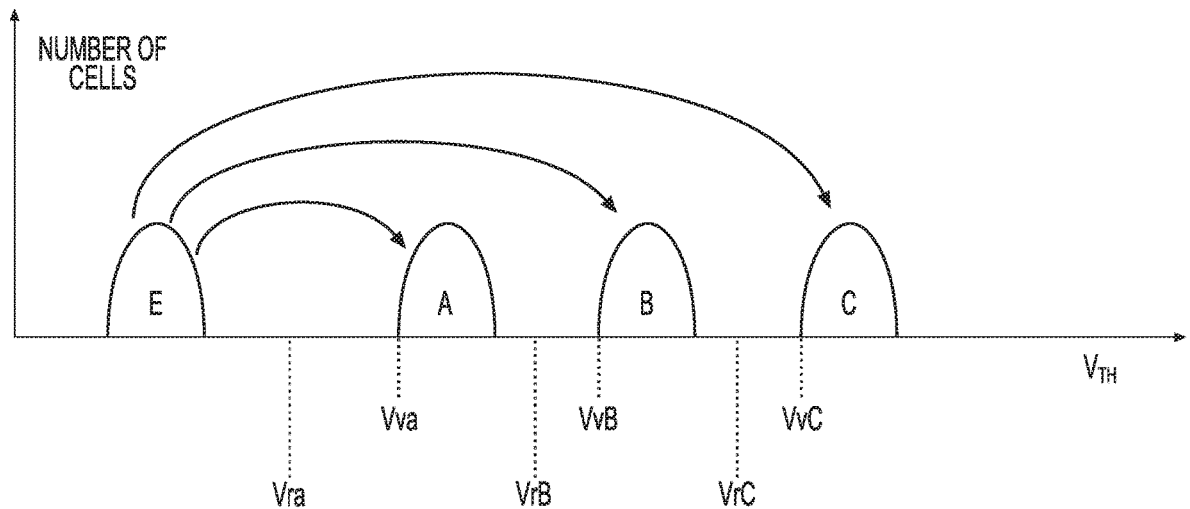
FIG. 6 depicts an exemplary set of threshold voltage distributions and a full sequence programming process according to aspects of the disclosure.

At the end of a successful program process, the threshold voltages of the memory cells should be within one or more distributions of threshold voltages for programmed memory cells or within a distribution of threshold voltages for erased memory cells, as appropriate. FIG. 6 illustrates threshold voltage Vt or Vth distributions for a group of memory cells when each memory cell stores two bits of data. FIG. 6 shows a first threshold voltage Vt distribution E for erased memory cells and three threshold voltage Vt distributions, A, B and C for programmed memory cells. In one embodiment, the threshold voltages in the E distribution are negative and the threshold voltages in the A, B and C distributions are positive.

Each distinct threshold voltage Vt range of FIG. 6 corresponds to predetermined values for the set of data bits. The specific relationship between the data programmed into the memory cell and the threshold voltage Vt levels of the cell depends upon the data encoding scheme adopted for the cells. In one embodiment, data values are assigned to the threshold voltage Vt ranges using a gray code assignment so that if the threshold voltage Vt of a floating gate erroneously shifts to its neighboring physical state, only one bit will be affected. However, in other embodiments, gray coding is not used. One example assigns "11" to threshold voltage Vt range E (state E), "10" to threshold voltage Vt range A (state A), "00" to threshold voltage Vt range B (state B) and "01" to threshold voltage Vt range C (state C). Although FIG. 6 shows four states, embodiments in accordance with the present disclosure can also be used with other binary or multi-state structures including those that include more or less than four states.

FIG. 6 shows three read reference voltages, Vra, Vrb and Vrc, for reading data from the memory cells. By testing whether the threshold voltage Vt of a given memory cell is above or below Vra, Vrb and Vrc, the system can determine what state the memory cell is in. If a memory cell conducts with Vra applied to its control gate, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. FIG. 6 also shows three verify reference voltages, Vva, Vvb and Vvc. When programming memory cells to state A, the system tests whether those memory cells have a threshold voltage Vt greater than or equal to Vva. When programming memory cells to state B, the system will test whether the memory cells have threshold voltages greater than or equal to Vvb. When programming memory cells to state C, the system will determine whether memory cells have their threshold voltage Vt greater than or equal to Vvc.

FIG. 6 also depicts a full sequence programming technique. In full sequence programming, memory cells are programmed from the erased state E directly to any of the programmed states A, B or C. A population of memory cells to be programmed may first be erased so that all the memory cells are in erased state E. A series of program voltage pulses is then applied to the control gates of the selected memory cells to program the memory cells directly into states A, B or C. While some memory cells are being programmed from state E to state A, other memory cells are being programmed from state E to state B and/or from state E to state C.

Figure 7:
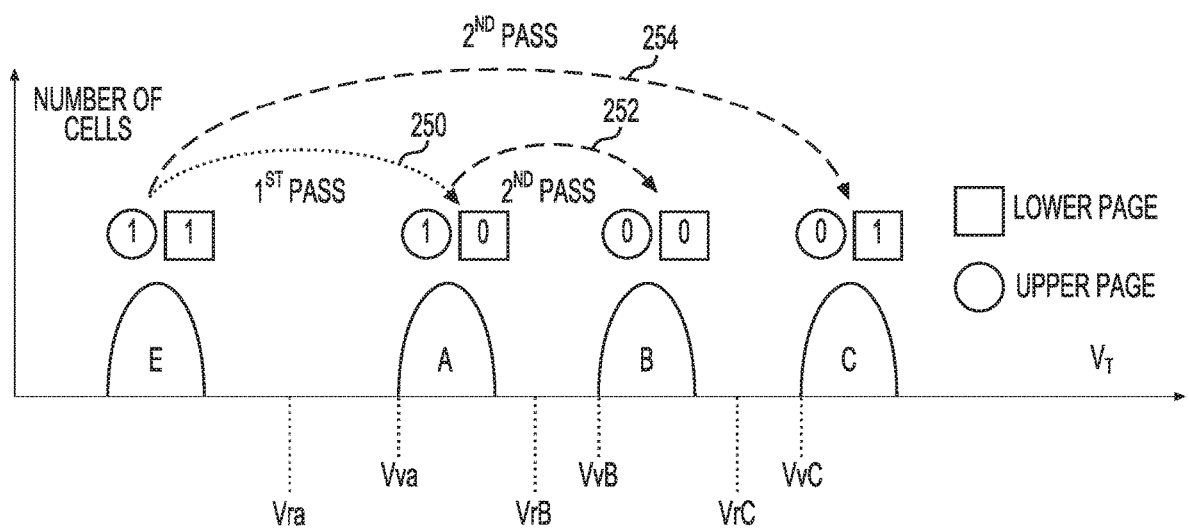
FIG. 7 depicts an exemplary set of threshold voltage distributions and an upper page/lower page programming process according to aspects of the disclosure.

FIG. 7 illustrates an example of a two-pass technique of programming multi-state memory cells that store data for two different pages: a lower page and an upper page. Four states are depicted. For state E, both pages store a "1". For state A, the lower page stores a 0 and the upper page stores a 1. For state B, both pages store 0. For state C, the lower page stores 1 and the upper page stores 0. Although specific bit patterns have been assigned to each of the states, different bit patterns may be assigned.

In a first programming pass, the cell's threshold voltage Vt level is set according to the bit to be programmed into the lower logical page. If that bit is a logic 1, the threshold voltage Vt is not changed since it is in the appropriate state as a result of having been earlier erased. However, if the bit to be programmed is a logic 0, the threshold level of the cell is increased to be state A, as shown by arrow 250. That concludes the first programming pass.

In a second programming pass, the cell's threshold voltage Vt level is set according to the bit being programmed into the upper logical page. If the upper logical page bit is to store a logic 1, then no programming occurs since the cell is in one of the states E or A, depending upon the programming of the lower page bit, both of which carry an upper page bit of 1. If the upper page bit is to be a logic 0, then the threshold voltage Vt is shifted. If the first pass resulted in the cell remaining in the erased state E, then in the second pass the cell is programmed so that the threshold voltage Vt is increased to be within state C, as depicted by arrow 254. If the cell had been programmed into state A as a result of the first programming pass, then the memory cell is further programmed in the second pass so that the threshold voltage Vt is increased to be within state B, as depicted by arrow 252. The result of the second pass is to program the cell into the state designated to store a logic "0" for the upper page without changing the data for the lower page.

Figure 8A:
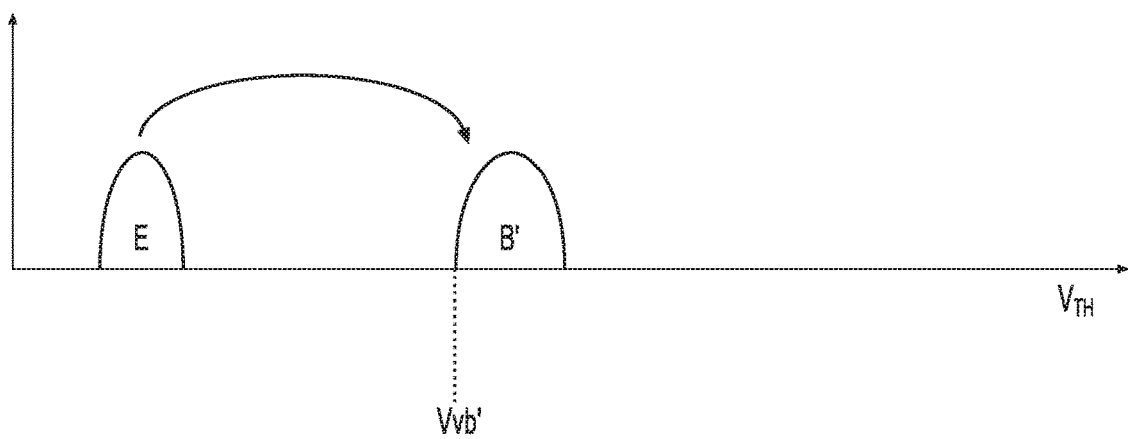
FIGS. 8A-8C depict an exemplary set of threshold voltages and a two-pass programming process according to aspects of the disclosure.
Figure 8B:
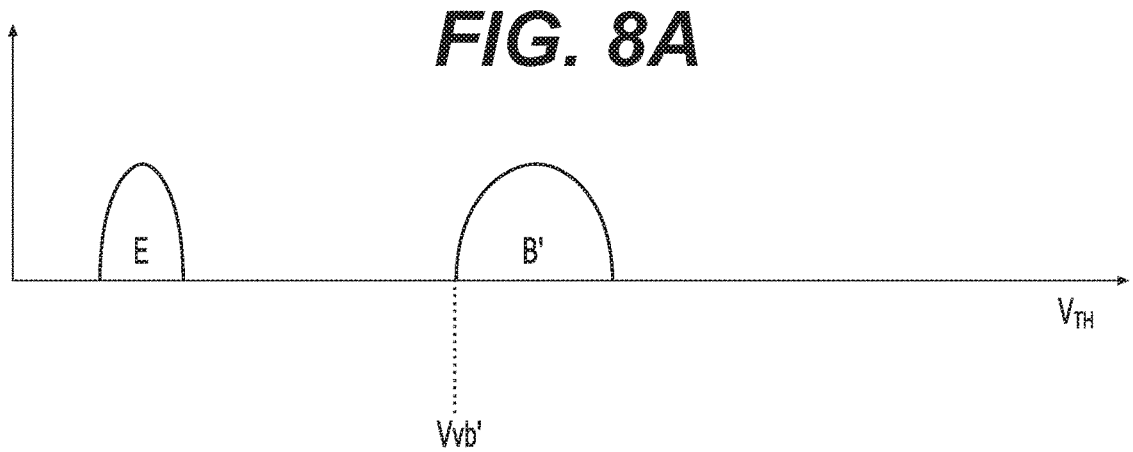
Figure 8C:
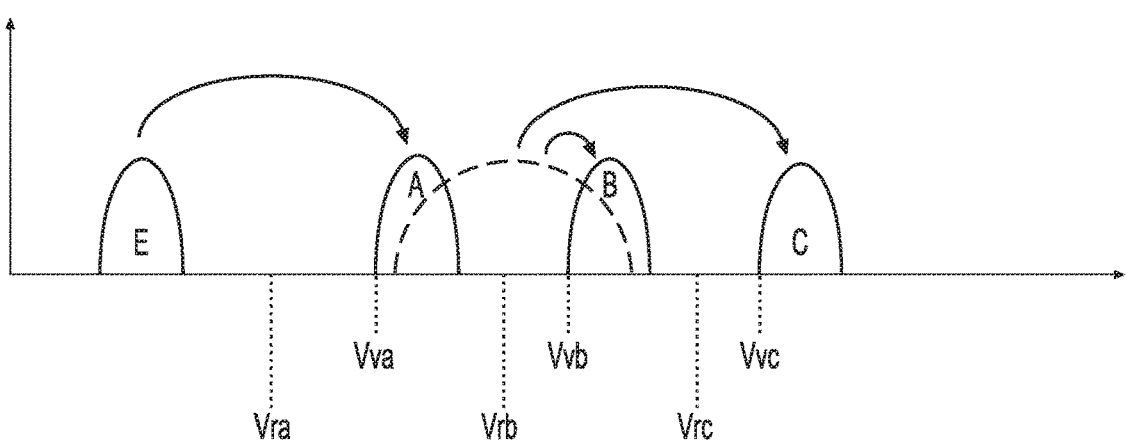

FIGS. 8A-8C disclose a process for programming non-volatile memory that reduces floating gate to floating gate coupling by, for any particular memory cell, writing to that particular memory cell with respect to a particular page subsequent to writing to adjacent memory cells for previous pages. This technique may be referred to herein as the last first mode (LM) of programming. In the example of FIGS. 8A-8C, each cell stores two bits of data per memory cell, using four data states. Erased state E stores data 11, state A stores data 01, state B stores data 10, and state C stores data 00. Other encodings of data to physical data states can also be used. Each memory cell stores a portion of two logical pages of data. For reference purposes, these pages are called upper page and lower page but can be given other labels. State A is encoded to store bit 0 for the upper page and bit 1 for the lower page, state B is encoded to store bit 1 for the upper page and bit 0 for the lower page, and state C is encoded to store bit 0 for both pages. The lower page data for memory cells at a word line WLn are programmed in a first step depicted in FIG. 8A and upper page data for the cells is programmed in a second step depicted in FIG. 8C. If the lower page data is to remain data 1 for a cell, then the cell's threshold voltage Vt remains at state E during the first step. If the lower page data is to be programmed to 0, then the threshold voltage Vt of the memory cell is raised to state B'. State B' is an interim state B having a verify level Vvb', which is lower than Vvb.

After the lower page data for the memory cell is programmed, the neighboring memory cells at adjacent word line WLn+1 can be programmed with respect to their lower page. For example, the lower page for memory cells at WL2 in FIGS. 1-3 may be programmed after the lower page for memory cells at WL1 (i.e., normal-order programming as discussed above). Floating gate coupling may raise the apparent threshold voltage Vt of memory cell 12 if the threshold voltage Vt of memory cell 10 is raised from state E to state B' after programming memory cell 12. The cumulative coupling effect on the memory cells at WLn will widen the apparent threshold voltage Vt distribution of threshold voltages for the cells, as depicted as in FIG. 8B. The apparent widening of the threshold voltage Vt distribution can be remedied when programming the upper page for the word line of interest, as shown in FIG. 8C.

FIG. 8C depicts the process of programming the upper page for the cell at WLn. If a memory cell is in erased state E and its upper page bit is to remain at 1, the memory cell remains in state E. If the memory cell is in state E and its upper page data bit is to be programmed to 0, the threshold voltage Vt of the memory cell is raised to be within the range for state A. If the memory cell was in intermediate threshold voltage Vt distribution B' and its upper page data is to remain 1, the memory cell is programmed to final state B. If the memory cell is in intermediate threshold voltage Vt distribution B' and its upper page data is to become data 0, the threshold voltage Vt of the memory cell is raised to be within the range for state C. The process depicted by FIGS. 8A-8C reduces the effect of floating gate coupling because only the upper page programming of neighbor memory cells will affect the apparent threshold voltage Vt of a given memory cell. An example of an alternate state coding for this technique is to move from intermediate state B' to state C when the upper page data is a 1, and to move to state B when the upper page data is 0.

FIGS. 9(0)-9(2) illustrate an example of programming a population of 8-state memory cells. FIG. 9(0) illustrates the population of memory cells programmable into eight distinct distributions of threshold voltages respectively representing memory states "Er"-"G". FIG. 9(1) illustrates the initial distribution of "erased" threshold voltages for an erased memory. FIG. 9(2) illustrates an example of the memory after many of the memory cells have been programmed. Essentially, a cell initially has an "erased" threshold voltage Vt and programming will move it to a higher value into one of the seven zones demarcated by verify levels Vva-Vvg. In this way, each memory cell can be programmed to one of the seven programmed state "A"-"G" or remain un-programmed in the "erased" ("Er") state. As the memory gets more programming, the initial distribution of the "erased" state as shown in FIG. 9(1) will become narrower and the erased state is represented by the "Er" state.

A 3-bit code having lower, middle and upper bits can be used to represent each of the eight memory states. For example, the "Er", "A", "B", "C", "D", "E", "F" and "G" states are respectively represented by "111", "011", "001", "101", "100", "000", "010" and "110". The 3-bit data may be read from the memory by sensing in "full-sequence" mode where the three bits are sensed together by sensing relative to the read demarcation threshold values or particular read voltages Vra-Vrg in seven sub-passes respectively.

Similarly, a 4-bit code will have lower, first middle, second middle and upper bits, representing each of the sixteen states. Although FIGS. 8A-8C provide an example with respect to four data states and two pages of data and FIGS. 9(0)-9(2) provide an example with respect to eight data states and three pages of data, the concepts can be applied to other implementations with more or less states and different numbers of pages.

Figures 10A, 10B:
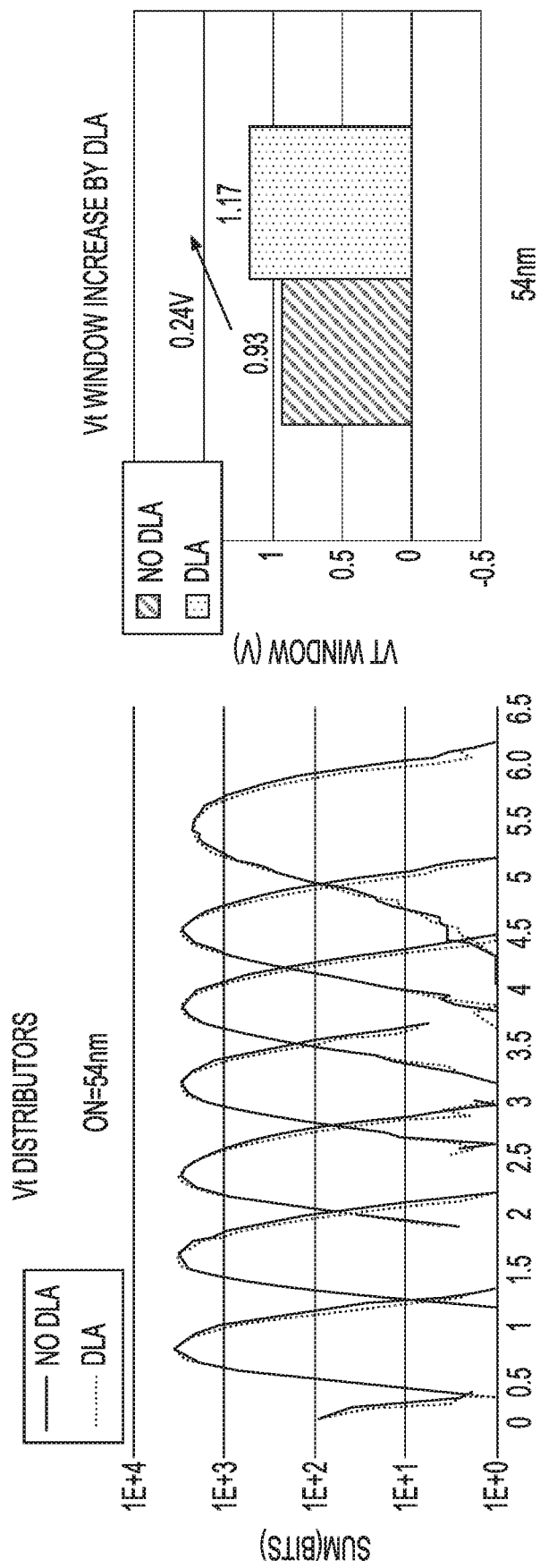

As discussed above and referring initially to FIGS. 10A, 10B, and 11, for normal-order programming (i.e., programming a particular word line WLn first and then programming a drain side neighbor word line WLn+1 or a word line on a drain side of the particular word line WLn) a 1-bit direct look ahead (DLA) read mode can implemented with different neighbor pass voltages (Vreadk) on the drain side neighbor word line WLn+1 to compensate neighboring word line interference (NWI) and lateral data retention (DR) loss on the particular word line WLn from data retention time. In addition, ±2.5σ level threshold voltage (Vt) window (e.g., spacing between states "A", "B", "C", "D", "E", "F" and "G" of FIG. 9(0)) is a key measure of device reliability. The higher or wider the Vt window is, the better the reliability is. Experimental Vt distributions can be seen in FIG. 10A with and without DLA. As shown in FIG. 10B, the direct look ahead mode increases Vt window by approximately 240 mV after a high temperature data retention (HTDR) test.

Instead of programming the drain side neighbor word line after programming the particular word line (i.e., normal-order programming), reverse-order program (ROP) may be used instead, as shown by arrow 300 in FIG. 11. In addition, a verify/read current flow is also shown by arrow 302. However, unlike normal-order programming, ROP programs a source side neighboring word line WLn−1 after the particular word line WLn, so more neighboring word line interference is from the source side neighbor word line WLn−1 than from the drain side neighbor word line WLn+1.

On the other hand, neighboring word line dependence of lateral data retention loss is rather symmetric and both WLn+/−1 have a similar effect.

Thus, disclosed herein is an apparatus (e.g., apparatus 110) employing 1-bit DLA mode with a source side neighbor word line WLn−1 read for reverse-order program (ROP) and zoned particular word line WLn with dependence on the source side neighbor word line WLn−1 states. Specifically, the apparatus can include a plurality of first memory cells coupled to a particular word line and storing a first cell data. The apparatus can also include a plurality of second memory cells coupled to a source side neighbor word line WLn−1 disposed on a source side of the particular word line WLn and storing second cell threshold voltages programmed after the first cell data in a reverse order programming sequence. The control circuit (e.g., control circuitry 120, and read/write circuits 130A and 130B) is coupled to the plurality of first and second memory cells and configured to sense the second cell threshold voltages at a first time while applying a predetermined initial read voltage to the source side neighbor word line WLn−1. The control circuit is also configured to sense the first cell data at a second time while iteratively applying one of a plurality of particular read voltages (e.g., Vra-Vrg of FIG. 9(0) or one of Vra-Vrg biased by a predetermined bias voltage) to the particular word line WLn and simultaneously and iteratively applying one of a plurality of neighbor pass voltages VREADK_LOW, VREADK_HIGH1, VREADK_HIGH2, VREADK_HIGH3, VREADK_HIGH4 to the source side neighbor word line WLn−1 based on the second cell threshold voltages sensed at the first time. The apparatus may also include a plurality of third memory cells (memory cells of the apparatus other than those coupled to the particular word line WLn or the source side neighbor word line WLn−1) coupled to one of a plurality of unselected word lines (e.g., WLn+1). Thus, the control circuit is configured to apply an unselected read voltage VREAD or WREADU to the plurality of unselected word lines while sensing the first cell data at the second time. So, as shown in FIG. 12, a DLA bias table 304 with a zone border 306 at state D and state-different neighbor pass voltages VREADK_LOW, VREADK_HIGH1, VREADK_HIGH2, VREADK_HIGH3, VREADK_HIGH4 on the source side neighbor word line WLn−1 can be utilized by the apparatus (e.g., used by controller 144 or processor 212).

The control circuit is further configured to select the one of the plurality of neighbor pass voltages VREADK_LOW, VREADK_HIGH1, VREADK_HIGH2, VREADK_HIGH3, VREADK_HIGH4 based on the one of the plurality of particular read voltages being applied to the particular word line WLn. As discussed above, each of the plurality of first and second memory cells are configured to retain a threshold voltage Vt of a common threshold voltage Vt range and representative of one of a plurality of states (e.g., states "A", "B", "C", "D", "E", "F" and "G" of FIG. 9(0)) of the each of the plurality of first and second memory cells and the plurality of second memory cells are each grouped into a plurality of zones 308, 310 and the control circuit is configured to select the predetermined initial read voltage based on the grouping of the plurality of second memory cells into the plurality of zones 308, 310.

According to an aspect, the plurality of zones 308, 310 includes a first zone 308 spanning first threshold voltages (e.g., states ER through D) and a second zone 310 spanning second threshold voltages larger than the first threshold voltages (e.g., states E through G). The first and second zones 308, 310 define a zone border state 312 of the plurality of states in the first zone 308 and adjacent the second zone 310 (i.e., a state at the edge of the first zone 308 immediately before the first state of the second zone 310 in the common threshold voltage Vt range). The control circuit is configured to select the predetermined initial read voltage as a state read voltage (e.g., Vre, if the zone border state is state D) of the one of plurality of states in the second zone 310 and immediately adjacent the zone border state 312.

The plurality of neighbor pass voltages VREADK_LOW, VREADK_HIGH1, VREADK_HIGH2, VREADK_HIGH3, VREADK_HIGH4 can include at least one lower pass voltage VREADK_LOW and at least one higher pass voltage VREADK_HIGH1, VREADK_HIGH2, VREADK_HIGH3, VREADK_HIGH4 being greater than the at least one lower pass voltage VREADK_LOW. Thus, the control circuit is configured to determine a first set of the plurality of second memory cells having the second cell threshold voltages representative of the plurality of states in the first zone 308 (e.g., cells having states from the ER state to the D state) and a second set of the plurality of second memory cells having the second cell threshold voltages representative of the plurality of states in the second zone 310 (e.g., cells being in one of states E through G). The control circuit then can apply the at least one lower pass voltage VREADK_LOW to the source side neighbor word line WLn−1 at the second time while reading of ones of the plurality of first memory cells adjacent the plurality of second memory cells in the first set. The control circuit can also be configured to apply the at least one higher pass voltage VREADK_HIGH1, VREADK_HIGH2, VREADK_HIGH3, VREADK_HIGH4 to the source side neighbor word line WLn−1 at the second time while reading of ones of the plurality of first memory cells adjacent the plurality of second memory cells in the second set. It should be appreciated that while the first zone 308 and the second zone 310 (respectively corresponding to the first and second sets of the plurality of second memory cells) are discussed herein, that any number of zones 308, 310 or sets may be used instead. In addition, the zone border state 312 can be any one of the plurality of states (e.g., a state other than state D).

Similar to the grouping of the possible states of the plurality of second memory cells into zones 308, 310, the plurality of states of the plurality of first memory cells can include a plurality of first memory cell groups 314, 316, 318, 320. Consequently, the control circuit is configured to select the at least one lower pass voltage VREADK-LOW and the at least one higher pass voltage VREADK_HIGH1, VREADK_HIGH2, VREADK_HIGH3, VREADK_HIGH4 based on the grouping of the plurality of first memory cells in the plurality of first memory cell groups 314, 316, 318, 320.

In more detail, the plurality of first memory cell groups 314, 316, 318, 320 includes a first memory cell group 314 and a second memory cell group 316 and a third memory cell group 318 and a fourth memory cell group 320. The first, second, third, and fourth memory cell groups 314, 316, 318, 320 respectively represent the threshold voltage Vt increasing in magnitude (so, for example, the first memory cell group 314 has cells having lower threshold voltages compared to the fourth memory cell group 320). The at least one higher pass voltage VREADK_HIGH1, VREADK_HIGH2, VREADK_HIGH3, VREADK_HIGH4 includes a first higher pass voltage VREADK_HIGH1 and a second higher pass voltage VREADK_HIGH2 and a third higher pass voltage VREADK_HIGH3 and a fourth higher pass voltage VREADK_HIGH4. Thus, the control circuit is configured to apply the first higher pass voltage VREADK_H-

IGH1 to the source side neighbor word line WLn−1 at the second time while reading of ones of the plurality of first memory cells with the one of the plurality of particular read voltages associated with the first memory cell group 314. Similarly, the control circuit is configured to apply the second higher pass voltage VREADK_HIGH2 to the source side neighbor word line WLn−1 at the second time while reading of ones of the plurality of first memory cells with the one of the plurality of particular read voltages associated with the second memory cell group 316. The control circuit is also configured to apply the third higher pass voltage VREADK_HIGH3 to the source side neighbor word line WLn−1 at the second time while reading of ones of the plurality of first memory cells with the one of the plurality of particular read voltages associated with the third memory cell group 318. Additionally, the control circuit is configured to apply the fourth higher pass voltage VREADK_HIGH4 to the source side neighbor word line WLn−1 at the second time while reading of ones of the plurality of first memory cells with the one of the plurality of particular read voltages associated with the fourth memory cell group 320. While only one lower pass voltage VREADK_LOW and four higher pass voltages VREADK_HIGH1, VREADK_HIGH2, VREADK_HIGH3, VREADK_HIGH4 are described herein, it should be understood that any number of lower pass voltages and any number of memory cell groups (corresponding to any number of higher pass voltages) can be employed by the apparatus.

A resulting plot of threshold voltages are shown is FIG. 13. The original threshold voltage Vt stored to the plurality of first memory cells (those coupled to the particular word line WLn) is indicated by 322. If the plurality of second memory cells (those coupled to the source side neighbor word line WLn−1) are in the first zone 308, the threshold voltage Vt of the plurality of first memory cells is shifted to the right as indicated by 324. If the plurality of second memory cells (those coupled to the source side neighbor word line WLn−1) are in the second zone 310, the threshold voltage Vt of the plurality of first memory cells is shifted to the left as indicated by 326. However, using the DLA mode described herein and implemented using the DLA table 304 in FIG. 12, the resulting DLA threshold voltage Vt of the plurality of first memory cells (indicated as 328) can remain close to the original threshold voltage Vt indicated by 322.

The voltage versus time waveform of FIG. 14 shows example operation of the apparatus using the DLA table 304 of FIG. 12 during a read of the particular word line (e.g., triple level cell middle page). The zone border state is state D. The first read is on the source side neighbor word line WLn−1 and the unchanged VREADU is applied to the drain side neighbor word line WLn+1. So, the read on the source side neighbor word line WLn−1 is done before a read on the particular word line WLn. As discussed above, the read level for the first read (i.e., the predetermined initial read voltage) depends on the zone border setting (i.e., the zone border state). In the example, the zone border is set to be state D so the read level would be Vre. During the read of the particular word line WLn, for the plurality of second memory cells in the first zone 308, VREADK_LOW is applied to all of the plurality of second memory cells for all states; for the second zone 310, the four higher pass voltages VREADK_HIGH1, VREADK_HIGH2, VREADK_HIGH3, VREADK_HIGH4 are used depending on the different states of the first memory cells.

FIG. 15 shows additional details regarding the improved DLA mode operation for ROP using the DLA table 304 of FIG. 12. Because ROP programs the source side neighbor word line WLn−1 after the particular word line WLn. The neighboring word line interference on WLn due to the source side neighbor word line is larger than from the drain side neighbor word line WLn+1 because the band diagram change from program verify PVERIFY to READ (e.g., when reading the plurality of first memory cells) is from the programmed WLn−1 which changes the real cell source voltage VCELSRC and drain-to-source voltage Vds subsequently. As shown, the threshold voltage Vt of the particular word line WLn shifts up as the source side neighbor word line WLn−1 changes from Er to G. The DLA mode described herein works by changing the neighbor pass voltage VREADK on WLn−1 and thus more effectively suppressing neighboring word line interference for ROP. On the other hand, lateral DR loss variation due to WLn−1 states should be similar to that from WLn+1 states (also see FIGS. 18 and 19). The lateral data retention loss is also remedied by the disclosed DLA mode as well.

FIG. 16 shows an increase of the threshold voltage Vt window using a DLA mode typically used with normal-order programming (with the read pass voltage adjusted for WLn+1 instead of WLn−1) with ON=46 nm. The increase shown (0.17 volts) is even less than that with ON=54 nm (0.17 volts<0.24 volts). In comparison, with the DLA mode described herein used with ROP, the threshold voltage Vt window increases to 0.46 volts, as shown in FIG. 17. So, compared with the original DLA (used for normal-order programming), the apparatus disclosed herein is almost three times more effective in terms of Vt window increase on ON=46 nm word lines, as shown going from 0.17 volts to 0.46 volts. These results are obtained through emulation by first programming in reverse order and grouping separate Vt measurements on three ON=46 nm word lines with different neighbor pass voltage settings on WLn+1 and WLn−1.

As can be observed from the zero hour data of FIGS. 18 and 19, with ROP, WLn−1 has larger NWI effect on WLn than WLn+1. When WLn+1 changes from Er to G, WLn Vt shift is small. Whereas, when WLn−1 changes from Er to G, WLn Vt shift is large. Meanwhile, the Vt shifts due to DR loss after 17 hr HTDR are similar between WLn+1=Er and WLn−1=Er.

As best shown in FIGS. 20 and 21A-21B, a method of operating a memory apparatus (e.g., apparatus 110) is also provided. Such a method can, for example, be carried out by a control circuit (e.g., control circuitry 120, and read/write circuits 130A and 13B) of the memory apparatus. Again, the apparatus includes the plurality of first memory cells coupled to the particular word line WLn and storing the first cell data. The memory apparatus also includes the plurality of second memory cells coupled to the source side neighbor word line WLn−1 disposed on the source side of the particular word line WLn and storing the second cell threshold voltages programmed after the first cell data in a reverse order programming sequence. The method includes the step of 400 sensing the second cell threshold voltages at a first time while applying a predetermined initial read voltage to the source side neighbor word line WLn−1. The method continues with the step of 402 sensing the first cell data at a second time while iteratively applying one of a plurality of particular read voltages to the particular word line WLn and simultaneously and iteratively applying one of a plurality of neighbor pass voltages VREADK_LOW, VREADK_HIGH1, VREADK_HIGH2, VREADK_HIGH3, VREADK_HIGH4 to the source side neighbor word line WLn−1 based on the second cell threshold voltages sensed at the first time. The method can further include the step of 404 selecting the one of the plurality of neighbor pass voltages VREADK_LOW, VREADK_HIGH1, VREADK_HIGH2, VREADK_HIGH3, VREADK_HIGH4 based on the one of the plurality of particular read voltages being applied to the particular word line WLn.

As discussed above, each of the plurality of first and second memory cells are configured to retain a threshold voltage Vt of a common threshold voltage Vt range and representative of one of a plurality of states of the each of the plurality of first and second memory cells. Also, the plurality of second memory cells can each be grouped into the plurality of zones 308, 310. Thus, the method further includes the step of 406 selecting the predetermined initial read voltage based on the grouping of the plurality of second memory cells into the plurality of zones 308, 310.

Again, the plurality of zones 308, 310 can include a first zone 308 spanning first threshold voltages and a second zone 310 spanning second threshold voltages larger than the first threshold voltages. The first and second zones 308, 310 define a zone border state 312 (e.g., state D) of the plurality of states in the first zone 308 and adjacent the second zone 310. Consequently, the method further includes the step of 408 selecting the predetermined initial read voltage as a state read voltage of the one of plurality of states in the second zone 310 and immediately adjacent the zone border state 312.

The plurality of neighbor pass voltages VREADK_LOW, VREADK_HIGH1, VREADK_HIGH2, VREADK_HIGH3, VREADK_HIGH4 includes at least one lower pass voltage VREADK_LOW and at least one higher pass voltage VREADK_HIGH1, VREADK_HIGH2, VREADK_HIGH3, VREADK_HIGH4 being greater than the at least one lower pass voltage VREADK_LOW. Also, the plurality of states of the plurality of first memory cells can include a plurality of first memory cell groups 314, 316, 318, 320. So, the method can also include the step of 410 selecting the at least one lower pass voltage VREADK_LOW and the at least one higher pass voltage VREADK_HIGH1, VREADK_HIGH2, VREADK_HIGH3, VREADK_HIGH4 based on the grouping of the plurality of first memory cells in the plurality of first memory cell groups 314, 316, 318, 320. The method further includes the step of 412 determining a first set of the plurality of second memory cells having the second cell threshold voltages representative of the plurality of states in the first zone 308 and a second set of the plurality of second memory cells having the second cell threshold voltages representative of the plurality of states in the second zone 310. The method continues with the step of 414 applying the at least one lower pass voltage VREADK_LOW to the source side neighbor word line WLn−1 at the second time while reading of ones of the plurality of first memory cells adjacent the plurality of second memory cells in the first set. The method proceeds by 416 applying the at least one higher pass voltage VREADK_HIGH1, VREADK_HIGH2, VREADK_HIGH3, VREADK_HIGH4 to the source side neighbor word line WLn−1 at the second time while reading of ones of the plurality of first memory cells adjacent the plurality of second memory cells in the second set.

More specifically, the plurality of first memory cell groups 314, 316, 318, 320 can include a first memory cell group 314 and a second memory cell group 316 and a third memory cell group 318 and a fourth memory cell group 320. The first, second, third, and fourth memory cell groups 314, 316, 318, 320 respectively represent the threshold voltage Vt increasing in magnitude and the at least one higher pass voltage VREADK_HIGH1, VREADK_HIGH2, VREADK_HIGH3, VREADK_HIGH4 includes a first higher pass voltage VREADK_HIGH1 and a second higher pass voltage VREADK_HIGH2 and a third higher pass voltage VREADK_HIGH3 and a fourth higher pass voltage VREADK_HIGH4. Therefore, the method can further include the step of 418 applying the first higher pass voltage VREADK_HIGH1 to the source side neighbor word line Wln−1 at the second time while reading of ones of the plurality of first memory cells with the one of the plurality of particular read voltages associated with the first memory cell group 314. The method can then include the step of 420 applying the second higher pass voltage VREADK_HIGH2 to the source side neighbor word line WLn−1 at the second time while reading of ones of the plurality of first memory cells with the one of the plurality of particular read voltages associated with the second memory cell group 316. The method also includes the step of 422 applying the third higher pass voltage VREADK_HIGH3 to the source side neighbor word line WLn−1 at the second time while reading of ones of the plurality of first memory cells with the one of the plurality of particular read voltages associated with the third memory cell group 318. In addition, the method can include the step of 424 applying the fourth higher pass voltage VREADK_HIGH4 to the source side neighbor word line WLn−1 at the second time while reading of ones of the plurality of first memory cells with the one of the plurality of particular read voltages associated with the fourth memory cell group 320.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. An apparatus, comprising:
a plurality of first memory cells coupled to a particular word line and storing a first cell data;
a plurality of second memory cells coupled to a source side neighbor word line disposed on a source side of the particular word line and storing second cell threshold voltages programmed after the first cell data in a reverse order programming sequence; and
a control circuit coupled to the plurality of first and second memory cells and configured to:
sense the second cell threshold voltages at a first time while applying a predetermined initial read voltage to the source side neighbor word line, and
sense the first cell data at a second time while iteratively applying one of a plurality of particular read voltages to the particular word line and simultaneously and iteratively applying one of a plurality of neighbor pass voltages to the source side neighbor word line based on the second cell threshold voltages sensed at the first time.

2. The apparatus as set forth in claim 1, wherein the control circuit is further configured to select the one of the plurality of neighbor pass voltages based on the one of the plurality of particular read voltages being applied to the particular word line.

3. The apparatus as set forth in claim 1, wherein each of the plurality of first and second memory cells are configured to retain a threshold voltage of a common threshold voltage range and representative of one of a plurality of states of the each of the plurality of first and second memory cells and the plurality of states are each grouped into a plurality of zones and the control circuit is configured to select the predetermined initial read voltage based on the grouping of the plurality of second memory cells into the plurality of zones.

4. The apparatus as set forth in claim 3, wherein the plurality of zones includes a first zone spanning first threshold voltages and a second zone spanning second threshold voltages larger than the first threshold voltages, the first and second zones defining a zone border state of the plurality of states in the first zone and adjacent the second zone and the control circuit is configured to select the predetermined initial read voltage as a state read voltage of the one of plurality of states in the second zone and immediately adjacent the zone border state.

5. The apparatus as set forth in claim 4, wherein the plurality of neighbor pass voltages includes at least one lower pass voltage and at least one higher pass voltage being greater than the at least one lower pass voltage and the control circuit is configured to:
determine a first set of the plurality of second memory cells having the second cell threshold voltages representative of the plurality of states in the first zone and a second set of the plurality of second memory cells having the second cell threshold voltages representative of the plurality of states in the second zone,
apply the at least one lower pass voltage to the source side neighbor word line at the second time while reading of ones of the plurality of first memory cells adjacent the plurality of second memory cells in the first set, and
apply the at least one higher pass voltage to the source side neighbor word line at the second time while reading of ones of the plurality of first memory cells adjacent the plurality of second memory cells in the second set.

6. The apparatus as set forth in claim 5, wherein the plurality of states of the plurality of first memory cells include a plurality of first memory cell groups and the control circuit is configured to select the at least one lower pass voltage and at least one higher pass voltage of the plurality of neighbor pass voltages based on the grouping of the plurality of first memory cells in the plurality of first memory cell groups.

7. The apparatus as set forth in claim 6, wherein the plurality of first memory cell groups includes a first memory cell group and a second memory cell group and a third memory cell group and a fourth memory cell group, the first, second, third, and fourth memory cell groups respectively representing the threshold voltage increasing in magnitude and the at least one higher pass voltage includes a first higher pass voltage and a second higher pass voltage and a third higher pass voltage and a fourth higher pass voltage and the control circuit is configured to:
apply the first higher pass voltage to the source side neighbor word line at the second time while reading of ones of the plurality of first memory cells adjacent the plurality of second memory cells in the second set with the one of the plurality of particular read voltages associated with the first memory cell group,
apply the second higher pass voltage to the source side neighbor word line at the second time while reading of ones of the plurality of first memory cells adjacent the plurality of second memory cells in the second set with the one of the plurality of particular read voltages associated with the second memory cell group,
apply the third higher pass voltage to the source side neighbor word line at the second time while reading of ones of the plurality of first memory cells adjacent the plurality of second memory cells in the second set with the one of the plurality of particular read voltages associated with the third memory cell group, and apply the fourth higher pass voltage to the source side neighbor word line at the second time while reading of ones of the plurality of first memory cells adjacent the plurality of second memory cells in the second set with the one of the plurality of particular read voltages associated with the fourth memory cell group.

8. A controller in communication with a plurality of first memory cells of a memory apparatus coupled to a particular word line and storing a first cell data and a plurality of second memory cells of a memory apparatus coupled to a source side neighbor word line disposed on a source side of the particular word line and storing second cell threshold voltages programmed after the first cell data in a reverse order programming sequence, the controller configured to:

instruct the memory apparatus to sense the second cell threshold voltages at a first time while applying a predetermined initial read voltage to the source side neighbor word line; and instruct the memory apparatus to sense the first cell data at a second time while iteratively applying one of a plurality of particular read voltages to the particular word line and simultaneously and iteratively applying one of a plurality of neighbor pass voltages to the source side neighbor word line based on the second cell threshold voltages sensed at the first time.

9. The controller as set forth in claim 8, wherein the controller is further configured to select the one of the plurality of neighbor pass voltages based on the one of the plurality of particular read voltages being applied to the particular word line.

10. The controller as set forth in claim 8, wherein each of the plurality of first and second memory cells are configured to retain a threshold voltage of a common threshold voltage range and representative of one of a plurality of states of the each of the plurality of first and second memory cells and the plurality of states are each grouped into a plurality of zones and the control circuit is configured to select the predetermined initial read voltage based on the grouping of the plurality of second memory cells into the plurality of zones.

11. The controller as set forth in claim 10, wherein the plurality of zones includes a first zone spanning first threshold voltages and a second zone spanning second threshold voltages larger than the first threshold voltages, the first and second zones defining a zone border state of the plurality of states in the first zone and adjacent the second zone and the controller is configured to select the predetermined initial read voltage as a state read voltage of the one of plurality of states in the second zone and immediately adjacent the zone border state.

12. The controller as set forth in claim 11, wherein the plurality of neighbor pass voltages includes at least one lower pass voltage and at least one higher pass voltage being greater than the at least one lower pass voltage and the controller is configured to:

determine a first set of the plurality of second memory cells having the second cell threshold voltages representative of the plurality of states in the first zone and a second set of the plurality of second memory cells having the second cell threshold voltages representative of the plurality of states in the second zone;

instruct the memory apparatus to apply the at least one lower pass voltage to the source side neighbor word line at the second time while reading of ones of the plurality of first memory cells adjacent the plurality of second memory cells in the first set; and instruct the memory apparatus to apply the at least one higher pass voltage to the source side neighbor word line at the second time while reading of ones of the plurality of first memory cells adjacent the plurality of second memory cells in the second set.

13. The controller as set forth in claim 12, wherein the plurality of states of the plurality of first memory cells include a plurality of first memory cell groups and the controller is configured to select the at least one lower pass voltage and the at least one higher pass voltage of the plurality of neighbor pass voltages based on the grouping of the plurality of states in the plurality of first memory cell groups.

14. A method of operating a memory apparatus including a plurality of first memory cells coupled to a particular word line and storing a first cell data and a plurality of second memory cells coupled to a source side neighbor word line disposed on a source side of the particular word line and storing second cell threshold voltages programmed after the first cell data in a reverse order programming sequence, the method comprising the steps of:

sensing the second cell threshold voltages at a first time while applying a predetermined initial read voltage to the source side neighbor word line; and sensing the first cell data at a second time while iteratively applying one of a plurality of particular read voltages to the particular word line and simultaneously and iteratively applying one of a plurality of neighbor pass voltages to the source side neighbor word line based on the second cell threshold voltages sensed at the first time.

15. The method as set forth in claim 14, further including the step of selecting the one of the plurality of neighbor pass voltages based on the one of the plurality of particular read voltages being applied to the particular word line.

16. The method as set forth in claim 14, wherein each of the plurality of first and second memory cells are configured to retain a threshold voltage of a common threshold voltage range and representative of one of a plurality of states of the each of the plurality of first and second memory cells and the plurality of states are each grouped into a plurality of zones and the method further includes the step of selecting the predetermined initial read voltage based on the grouping of the plurality of second memory cells into the plurality of zones.

17. The method as set forth in claim 16, wherein the plurality of zones includes a first zone spanning first threshold voltages and a second zone spanning second threshold voltages larger than the first threshold voltages, the first and second zones defining a zone border state of the plurality of states in the first zone and adjacent the second zone and the method further includes the step of selecting the predetermined initial read voltage as a state read voltage of the one of plurality of states in the second zone and immediately adjacent the zone border state.

18. The method as set forth in claim 17, wherein the plurality of neighbor pass voltages includes at least one lower pass voltage and at least one higher pass voltage being greater than the at least one lower pass voltage and the method further includes the steps of:

determining a first set of the plurality of second memory cells having the second cell threshold voltages representative of the plurality of states in the first zone and a second set of the plurality of second memory cells having the second cell threshold voltages representative of the plurality of states in the second zone;

applying the at least one lower pass voltage to the source side neighbor word line at the second time while reading of ones of the plurality of first memory cells adjacent the plurality of second memory cells in the first set; and applying the at least one higher pass voltage to the source side neighbor word line at the second time while reading of ones of the plurality of first memory cells adjacent the plurality of second memory cells in the second set.

19. The method as set forth in claim 18 wherein the plurality of states of the plurality of first memory cells include a plurality of first memory cell groups and the method further includes the step of selecting the at least one lower pass voltage and the at least one higher pass voltage of the plurality of neighbor pass voltages based on the grouping of the plurality of first memory cells in the plurality of first memory cell groups.

20. The method as set forth in claim 19, wherein the plurality of first memory cell groups includes a first memory cell group and a second memory cell group and a third memory cell group and a fourth memory cell group, the first, second, third, and fourth memory cell groups respectively representing the threshold voltage increasing in magnitude and the at least one higher pass voltage includes a first higher pass voltage and a second higher pass voltage and a third higher pass voltage and a fourth higher pass voltage and the method further including the steps of:

applying the first higher pass voltage to the source side neighbor word line at the second time while reading of ones of the plurality of first memory cells adjacent the plurality of second memory cells in the second set with the one of the plurality of particular read voltages associated with the first memory cell group, applying the second higher pass voltage to the source side neighbor word line at the second time while reading of ones of the plurality of first memory cells adjacent the plurality of second memory cells in the second set with the one of the plurality of particular read voltages associated with the second memory cell group, applying the third higher pass voltage to the source side neighbor word line at the second time while reading of ones of the plurality of first memory cells adjacent the plurality of second memory cells in the second set with the one of the plurality of particular read voltages associated with the third memory cell group, and applying the fourth higher pass voltage to the source side neighbor word line at the second time while reading of ones of the plurality of first memory cells adjacent the plurality of second memory cells in the second set with the one of the plurality of particular read voltages associated with the fourth memory cell group.

* * * * *